(12) United States Patent
Kang

(10) Patent No.: US 12,446,234 B2
(45) Date of Patent: Oct. 14, 2025

(54) RESISTIVE MEMORY DEVICE AND MANUFACTURING METHOD OF THE RESISTIVE MEMORY DEVICE

(71) Applicant: SK hynix Inc., Icheon-si (KR)

(72) Inventor: In Ku Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 513 days.

(21) Appl. No.: 17/833,647

(22) Filed: Jun. 6, 2022

(65) Prior Publication Data

US 2023/0240084 A1 Jul. 27, 2023

(30) Foreign Application Priority Data

Jan. 21, 2022 (KR) .................. 10-2022-0009493

(51) Int. Cl.
*H01L 27/24* (2006.01)
*G11C 13/00* (2006.01)
(Continued)

(52) U.S. Cl.
CPC ......... *H10B 63/84* (2023.02); *G11C 13/0002* (2013.01); *H10B 63/34* (2023.02);
(Continued)

(58) Field of Classification Search
CPC .... H10N 70/063; H10N 70/24; H10N 70/826; H10N 70/8833; H10N 70/8836; H10B 63/80; H10B 63/84; H10B 63/845
See application file for complete search history.

(56) References Cited

U.S. PATENT DOCUMENTS

| | | | |
|---|---|---|---|
| 9,059,395 B2* | 6/2015 | Ju | H10N 70/8265 |
| 2013/0334594 A1* | 12/2013 | Imonigie | H10B 43/35 |
| | | | 257/326 |

(Continued)

FOREIGN PATENT DOCUMENTS

| | | | | |
|---|---|---|---|---|
| KR | 1020140068627 A | | 6/2014 | |
| KR | 1020210100388 | * | 8/2021 | ......... H01L 27/0629 |

(Continued)

OTHER PUBLICATIONS

Machine translation, Hwang, Korean Pat. Pub. No. KR20210100388, translation date: Nov. 21, 2024, Espacenet, all pages. (Year: 2024).*

(Continued)

*Primary Examiner* — Victoria K. Hall
(74) *Attorney, Agent, or Firm* — WILLIAM PARK AND ASSOCIATES LTD.

(57) ABSTRACT

A resistive memory device includes: a stack structure in which a plurality of interlayer insulating layers and a plurality of conductive layers are alternately stacked; a hole penetrating the stack structure through the plurality of interlayer insulating layers and the plurality of conductive layers; a plurality of insulating patterns formed on a sidewall of each of the plurality of interlayer insulating layers within the hole; a channel layer formed along a sidewall of each of the plurality of conductive layers within the hole and a sidewall of each of the plurality of the insulating patterns within the hole, the channel layer including convex regions that are adjacent to the insulating patterns and are convexly formed in relation to a central portion of the hole and including concave regions that are adjacent to the plurality of conductive layers and are concavely formed in relation to the central portion of the hole.

12 Claims, 28 Drawing Sheets

(51) Int. Cl.
    *H01L 45/00*     (2006.01)
    *H10B 63/00*     (2023.01)
    *H10N 70/00*     (2023.01)
    *H10N 70/20*     (2023.01)

(52) U.S. Cl.
    CPC ......... *H10N 70/011* (2023.02); *H10N 70/063* (2023.02); *H10N 70/8265* (2023.02); *H10N 70/24* (2023.02); *H10N 70/8833* (2023.02)

(56) References Cited

U.S. PATENT DOCUMENTS

| | | | | |
|---|---|---|---|---|
| 2014/0145137 A1* | 5/2014 | Ju | ...................... | H10N 70/8833 |
| | | | | 257/2 |
| 2021/0265381 A1* | 8/2021 | Lee | ...................... | H10D 64/516 |
| 2021/0265382 A1* | 8/2021 | Kim | ...................... | H10D 30/693 |
| 2021/0408121 A1* | 12/2021 | Fantini | .................. | H10B 63/84 |

FOREIGN PATENT DOCUMENTS

| | | | |
|---|---|---|---|
| KR | 1020210100388 A | 8/2021 | |
| KR | 1020210106288 A | 8/2021 | |
| KR | 1020210106295 A | 8/2021 | |

OTHER PUBLICATIONS

Korean Intellectual Property Office, Request for the Submission of an Opinion, Korean Application No. 10-2022-0009493, Aug. 28, 2025, all pages. (Year: 2025).*

* cited by examiner

RESISTIVE MEMORY DEVICE AND MANUFACTURING METHOD OF THE RESISTIVE MEMORY DEVICE

CROSS-REFERENCE TO RELATED APPLICATION

The present application claims priority under 35 U.S.C. § 119(a) to Korean patent application number 10-2022-0009493 filed on Jan. 21, 2022, in the Korean Intellectual Property Office, the entire disclosure of which is incorporated by reference herein.

BACKGROUND

1. Technical Field

The present disclosure generally relates to a resistive memory device and a manufacturing method of the resistive memory device, and more particularly, to a resistive memory device in which data can be stored according to a change in resistance, and an operating method of the resistive memory device.

2. Related Art

A memory device may be classified into a volatile memory device in which stored data disappears when the supply of power is interrupted and a nonvolatile memory device in which stored data is retained even when the supply of power is interrupted.

The nonvolatile memory device may include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

Among these, the ReRAM may store data according to a change in resistance of variable resistance layer. For example, the ReRAM may include a top electrode and a bottom electrode, to which voltages are applied, and include a variable resistance layer located between the top electrode and the bottom electrode, to store data. The variable resistance layer may be programmed to a high resistance state or a low resistance state according to voltages applied to the top electrode and the bottom electrode, and be maintained in the high resistance state or the low resistance state, which is a previous state, until before another voltage is applied to the top electrode or the bottom electrode.

SUMMARY

In accordance with an aspect of the present disclosure, there is provided a resistive memory device including: a stack structure in which a plurality of interlayer insulating layers and a plurality of conductive layers are alternately stacked; a hole penetrating the stack structure through the plurality of interlayer insulating layers and the plurality of conductive layers; a plurality of insulating patterns formed on a sidewall of each of the plurality of interlayer insulating layers within the hole; a channel layer formed along a sidewall of each of the plurality of conductive layers within the hole and a sidewall of each of the insulating patterns within the hole, wherein the channel layer includes convex regions that are adjacent to the insulating patterns and are convexly formed in relation to a central portion of the hole and includes concave regions that are adjacent to the plurality of conductive layers and are concavely formed in relation to the central portion of the hole; and variable resistance layers in contact with the concave regions of the channel layer.

In accordance with another aspect of the present disclosure, there is provided a resistive memory device including: a stack structure in which a plurality of interlayer insulating layers and a plurality of conductive layers are alternately stacked; a hole penetrating the stack structure through the plurality of interlayer insulating layers and the plurality of conductive layers; a channel layer formed along a sidewall of the hole; and a plurality of variable resistance layers formed only on some regions of the channel layer, wherein a sidewall surface of each of the plurality of interlayer insulating layers within the hole are convexly formed, and a sidewall surface of each of the plurality of conductive layers within the hole are concavely formed.

In accordance with still another aspect of the present disclosure, there is provided a method of manufacturing a resistive memory device, the method including: forming a stack structure in which a plurality of first material layers and a plurality of second material layers are alternately stacked; forming a hole that penetrates the stack structure through the plurality of first material layers and the plurality of second material layers; forming an uneven sidewall of the hole by forming an insulating pattern on a sidewall of each of the first material layers, which is exposed through the hole; forming a gate insulating layer and a channel layer along the uneven sidewall of the hole, wherein the channel layer includes convex regions, in relation to a central portion of the hole, and concave regions, in relation to the central portion of the hole, between the convex regions; and forming variable resistance layers on the concave regions of the channel layer.

In accordance with still another aspect of the present disclosure, there is provided a method of manufacturing a resistive memory device, the method including: forming a stack structure in which first material layers and second material layers are alternately stacked; forming a hole that penetrates the stack structure through the plurality of first material layers and the plurality of second material layers; forming an insulating pattern on a sidewall of each of the first material layers, which is exposed through the hole; forming an uneven sidewall of the hole by etching a sidewall of each of the second material layers to a certain depth; forming a gate insulating layer and a channel layer along the uneven sidewall of the hole, wherein the channel layer includes convex regions, in relation to a central portion of the hole, and concave regions, in relation to the central portion of the hole, between the convex regions; and forming variable resistance layers on the concave regions of the channel layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a resistive memory device and a manufacturing method of the resistive memory device, in which a length of a variable resistance layer is formed relatively shorter than an effective channel length of a memory cell.

Figure 1:
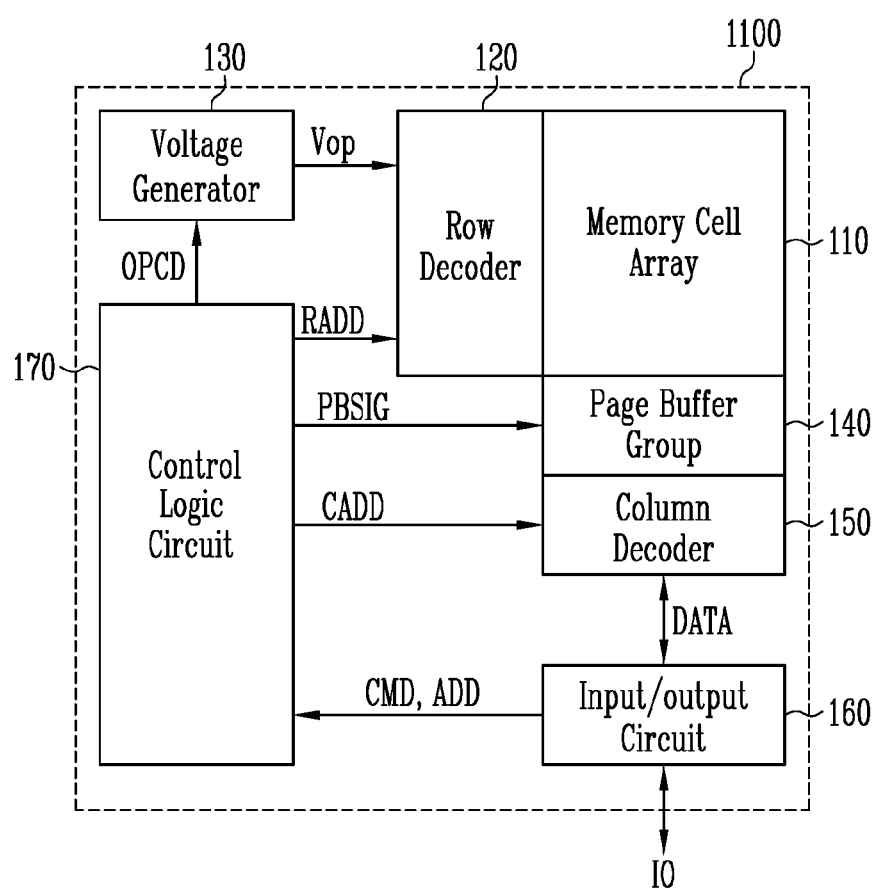
FIG. 1 is a diagram illustrating a resistive memory device in accordance with an embodiment of the present disclosure.

FIG. 1 is a diagram illustrating a resistive memory device in accordance with an embodiment of the present disclosure.

Referring to FIG. 1, the resistive memory device 1100 may include a memory cell array 110 in which data is stored and a peripheral circuit 120 to 170 capable of performing a program, read or erase operation.

The memory cell array 110 may include a plurality of memory blocks in which data is stored. Each of the memory blocks may include resistive random access memory cells, and the resistive random access memory cells may be implemented in a three-dimensional structure in which the resistive random access memory cells are stacked in a vertical direction above a substrate. The resistive random access memory cells may be configured such that resistance is changed according to a voltage that is applied to an electrode.

The peripheral circuit 120 to 170 may include a row decoder 120, a voltage generator 130, a page buffer group 140, a column decoder 150, an input/output circuit 160, and a control logic circuit 170.

The row decoder 120 may select one memory block, among the memory blocks, included in the memory cell array 110 according to a row address RADD and may transmit operating voltages Vop to the selected memory block.

The voltage generator 130 may generate and output the operating voltages Vop necessary for various operations in response to an operation code OPCD. For example, the voltage generator 130 may generate a set voltage, a reset voltage, a turn-on voltage, a turn-off voltage, a read voltage, an erase voltage, and the like in response to the operation code OPCD, and selectively output the generated voltages. In accordance with this embodiment, the voltage generator 130 may generate voltage of 0V or higher as voltages to be applied to word lines and might not include a device for generating a negative voltage lower than 0V.

The page buffer group 140 may be connected to the memory cell array 110 through bit lines. For example, the page buffer group 140 may include page buffers that are connected to the respective bit lines. The page buffers may simultaneously operate in response to page buffer control signals PBSIG and may temporarily store data in a program or read operation. The page buffers may sense a voltage of the bit lines, which varies according to threshold voltages of the memory cells, in a read operation or a verify operation. For example, when the resistance of the resistive random access memory cells becomes higher, the current of the bit lines decreases. When the resistance of the resistive random access memory cells becomes lower, the current of the bit lines increases. Therefore, the page buffers may be configured to sense a current of the bit lines, which is changed according to resistance of selected memory cells.

The column decoder 150 may transmit data DATA between the input/output circuit 160 and the page buffer group 140 according to a column address CADD.

The input/output circuit 160 may be connected to an external device through input/output lines IO. For example, the external device may be a controller that is capable of transmitting a command CMD, an address ADD, or data DATA to the resistive memory device 1100. The input/output circuit 160 may input/output a command CMD, an address ADD, and data DATA through the input/output lines IO. For example, the input/output circuit 160 may transmit the command CMD and the address ADD, which are received from the external device, to the control logic circuit 170 through the input/output lines IO, and transmit the data DATA that is received from the external device to the column decoder 150 through the input/output lines IO. The input/output circuit 160 may output the data DATA that is received from the column decoder 150 to the external device through the input/output lines IO.

The control logic circuit 170 may output the operation code OPCD, the row address RADD, the page buffer control signals PBSIG, and the column address CADD in response to the command CMD and the address ADD. For example, the control logic circuit 170 may include software for performing an algorithm in response to the command CMD and hardware for outputting the address ADD and various control signals.

Figure 2:
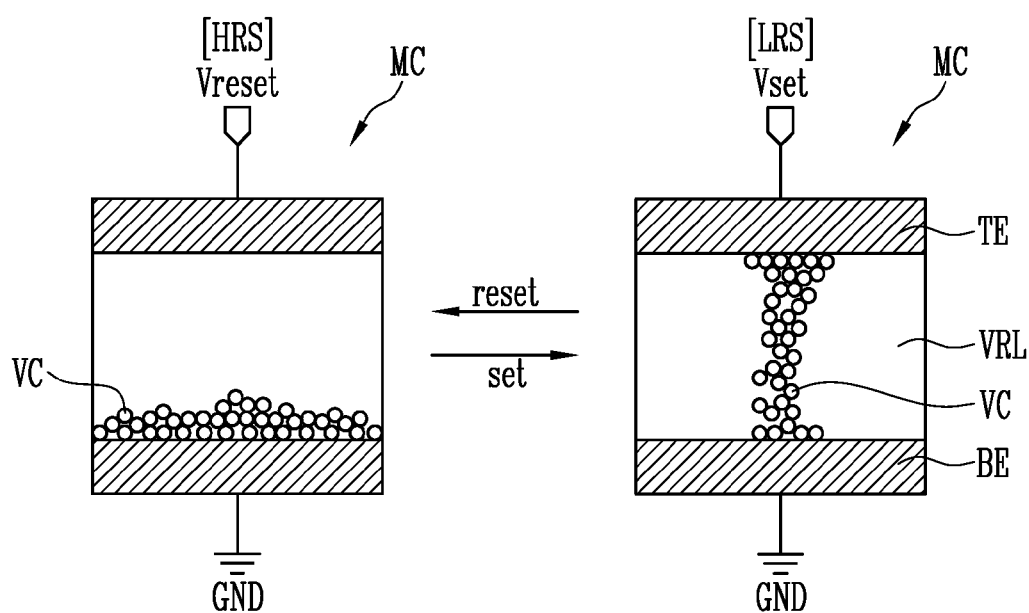
FIG. 2 is a view illustrating a state of a resistive random access memory cell in accordance with an embodiment of the present disclosure.

FIG. 2 is a view illustrating a state of a resistive random access memory cell in accordance with an embodiment of the present disclosure.

Referring to FIG. 2, the resistive random access memory cell MC may include a bottom electrode BE, a top electrode TE, and a variable resistance layer VRL. The bottom electrode BE and the top electrode TE may be formed of a conductive material, and the variable resistance layer VRL may be formed of a variable resistance material.

The bottom electrode BE and the top electrode TE may be formed of any one material or two or more materials among aluminum (Al), copper (Cu), titanium nitride (TiN), titanium aluminum nitride ($Ti_xAl_yN_z$), iridium (Ir), platinum (Pt), silver (Ag), gold (Au), poly-silicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), and strontium zirconate oxide ($StZrO_3$).

The variable resistance layer VRL may be formed of a bipolar resistance memory material or a unipolar resistance memory material. The bipolar resistance memory material may become a set or reset state according to different voltage that is applied to the bottom electrode BE and the top electrode TE. Perovskite-based materials may be used as the bipolar resistance memory material. The unipolar resistance memory material may be programmed to the set or reset state even by a voltage pulse having the same polarity. A transition metal oxide, such as nickel oxide ($NiO_x$), titanium oxide ($TiO_x$), or the like may be used as the unipolar resistance memory material.

Empty spaces of atoms exist in the variable resistance layer VRL, which are referred to as vacancies VC. Since the vacancy VC has a polarity, the vacancy VC may be moved according to voltages that are applied to the top electrode TE and the bottom electrode BE. For example, when a reset voltage Vreset is applied to the top electrode TE and a ground voltage GND is applied to the bottom electrode BE, the vacancy VC may be moved toward the top electrode TE. The reset voltage Vreset may be a negative voltage that is lower than 0V. When the vacancies VC are concentrated on the top electrode TE or the bottom electrode BE, any filament might not be formed between the top electrode TE and the bottom electrode BE, and therefore, resistance of the variable resistance layer VRL may become high. When the resistance of the variable resistance layer VRL becomes high, the resistive random access memory cell MC may be at a high resistance state HRS, and any current might not flow through the resistive random access memory cell MC due to the high resistance.

When a set voltage Vset is applied to the top electrode TE of the resistive random access memory cell MC in the high resistance state HRS and the ground voltage GND is applied to the bottom electrode BE, some of the vacancies VC that have been concentrated on the top electrode TE may be moved to the bottom electrode BE, and therefore, a filament may be formed between the top electrode TE and the bottom electrode BE. When the filament is formed between the top electrode TE and the bottom electrode BE, the resistance of the variable resistance layer VRL becomes low, and therefore, the resistive random access memory cell MC may become a low resistance state LRS. In the resistive random access memory cell MC in the low resistance state LRS, a current may flow through the filament between the top electrode TE and the bottom electrode BE.

That is, in the high resistance state HRS, the resistance of the variable resistance layer VRL increases, and therefore, the current may become low or might not flow. In the low resistance state LRS, the resistance of the variable resistance layer VRL decreases, and therefore, the current may become high. The resistive random access memory cell MC may be programmed or erased to the set or reset state according to a change in the resistance state.

Figure 3:
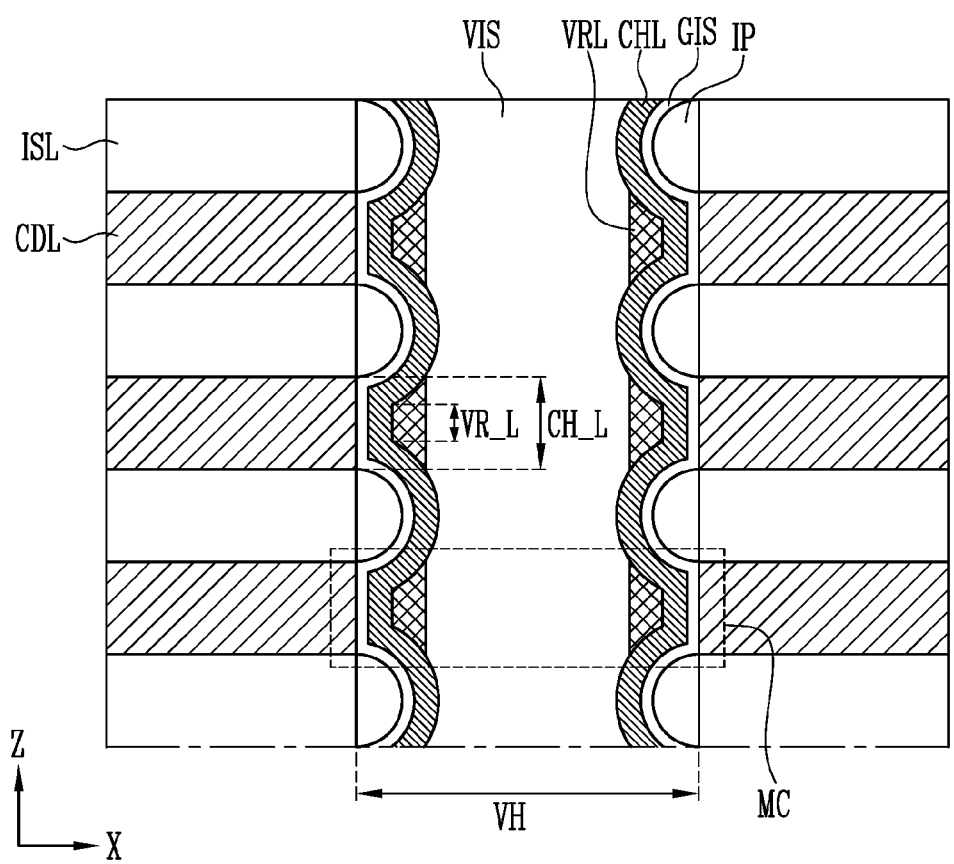
FIG. 3 is a sectional view illustrating a resistive memory device in accordance with an embodiment of the present disclosure.

FIG. 3 is a sectional view illustrating a resistive memory device in accordance with an embodiment of the present disclosure.

Referring to FIG. 3, the resistive memory device may include memory blocks including a plurality of resistive random access memory cells, and a portion of a string included in a memory block is illustrated in FIG. 3.

The string may include a plurality of resistive random access memory cells MC, and the plurality of resistive random access memory cells MC may be connected to conductive layers CDL corresponding to word lines. Interlayer insulating layers ISL may be formed between the conductive layers CDL. The conductive layers CDL and the interlayer insulating layers ISL may extend in an X direction as a direction parallel to a substrate. For example, the interlayer insulating layers ISL and the conductive layers CDL may be alternately stacked on the top of a lower structure (not shown). The lower structure may include the substrate or at least one of a source line, a source select line, and peripheral circuits, which are formed on the substrate. The conductive layers CDL may be used as word lines or select lines. For example, when assuming that the interlayer insulating layers ISL and the conductive layers CDL are alternately stacked on the substrate, the conductive layers CDL may include word lines and drain select lines. The interlayer insulating layers ISL may be formed of oxide, and the conductive layers CDL may be formed of a metal material, such as tungsten.

A vertical hole VH that penetrates the interlayer insulating layers ISL and the conductive layers CDL in a Z direction as a direction that is perpendicular to the substrate may be formed in the string, and an insulating pattern IP having a semicircular shape may be disposed on each of sidewalls of the interlayer insulating layers ISL, which are adjacent to the vertical hole VH. A gate insulating layer GIS, a channel layer CHL, a variable resistance layer VRL, and a vertical insulating layer VIS may be formed inside the vertical hole VH. For example, the vertical hole VH may be formed in a cylindrical shape, the insulating pattern IP may be disposed on each of the sidewalls of the interlayer insulating layers ISL in an inner wall of the vertical hole VH, and the gate insulating layer GIS and the channel layer CHL may be formed along sidewalls of the conductive layers CDL and sidewalls of the insulating patterns IP. The channel layer CHL may have concave portions in regions that are adjacent to the conductive layers CDL and convex portions in regions that are adjacent to the interlayer insulating layers ISL due to the insulating pattern IP that is disposed on the sidewall of each of the interlayer insulating layers ISL. The variable resistance layers VRL may be disposed at the concave portions of the channel layer CHL. That is, the variable resistance layers VRL may be formed at the concave portions of the channel layer CHL, which are adjacent to the conductive layers CDL, and adjacent variable resistance layers VRL may be physically spaced apart from each other due to the convex portions of the channel layer CHL. The vertical insulating layer VIS may be formed at a core portion of the vertical hole VH. In addition, the sidewall length of the variable resistance layers VRL that faces the respective conductive layers CDL may be formed to be shorter than a sidewall length of the conductive layers CDL.

In this embodiment, the variable resistance layer VRL may be used as a layer for storing data, and the channel layer CHL may be used to allow a current to flow in the string.

The gate insulating layer GIS and the vertical insulating layer VIS may be formed of oxide. The channel layer CHL may be formed of poly-silicon. At least one of a phase variation material, a perovskite-based material, and a transition metal oxide, such as $NiO_x$, $HfO_x$, $TaO_x$, $TiO_x$, or $SiHfO_x$, may be used for the variable resistance layer VRL.

In the resistive random access memory cells MC, a channel length CH_L is to be decreased to reduce interference between adjacent resistive random access memory cells and to improve a bias condition for a program-erase operation of an element. However, when the thickness of the conductive layers CDL that correspond to the word lines is decreased to decrease the channel length CH_L, an operation speed characteristic of the element due to an increase in RC delay may deteriorate. Accordingly, as described above, in an embodiment of the present disclosure, the channel layer CHL may be formed in an uneven shape including concave and convex portions in a state in which the thickness of the conductive layers CDL that correspond to the word lines is maintained, and the variable resistance layer VRL may be disposed in the concave portion of the channel layer CHL. Therefore, a vertical length VR_L of the variable resistance layer VRL may be formed shorter than the channel length CH_L. Thus, a bias for the program-erase operation of the element can be decreased. In addition, variable resistance layers VRL that correspond to each of the resistive random access memory cells MC are physically spaced apart from each other so that an inter-cell interference phenomenon can be reduced.

FIGS. 4A to 4E are sectional views illustrating a manufacturing method of the resistive memory device in accordance with an embodiment of the present disclosure.

Figure 4A:
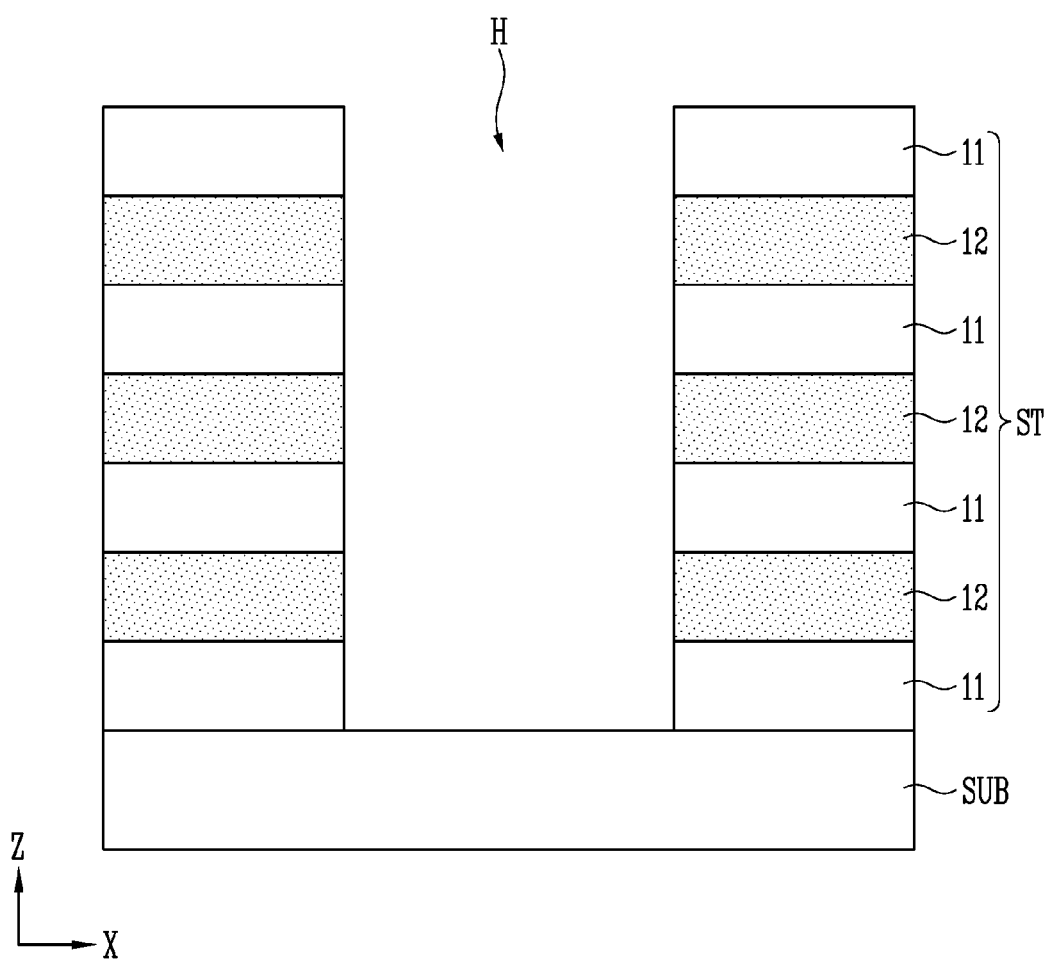
FIGS. 4A to 4E are sectional views illustrating a manufacturing method of the resistive memory device in accordance with an embodiment of the present disclosure.

Referring to FIG. 4A, a stack structure ST may be formed on a substrate SUB. The stack structure ST may include first material layers 11 and second material layers 12, which are alternately stacked. The first and second material layers 11 and 12 may extend in a first direction X, the first direction X extending in a direction horizontal to the substrate SUB. The first and second material layers 11 and 12 may be stacked in a second direction Z, the second direction Z being perpendicular to the substrate SUB. The first and second material layers 11 and 12 may be formed through a deposition process, such as Chemical Vapor Deposition (CVD).

The first material layers 11 may include a material having a high etch selectivity with respect to the second material layers 12. In an example, the first material layers 11 may include an insulating material, such as oxide, and the second material layers 12 may include a sacrificial material, such as nitride. In another example, the first material layers 11 may include an insulating material, such as oxide, and the second material layers 12 may include a conductive material, such as poly-silicon, tungsten, molybdenum or metal.

Subsequently, a hole H may be formed, which penetrates the stack structure ST. The hole H may have a cylindrical shape extending in the second direction Z.

Figure 4B:
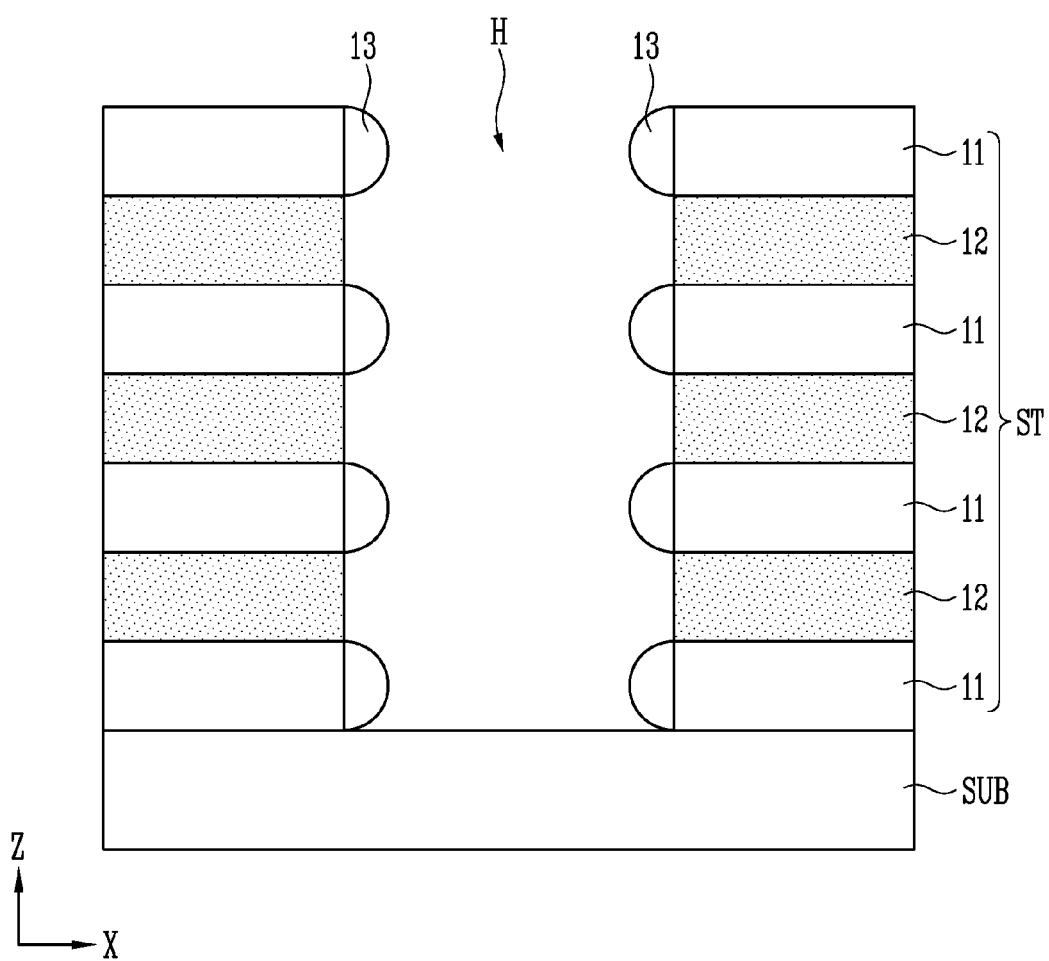

Referring to FIG. 4B, an insulating pattern 13 may be formed on each of sidewalls of the first material layers 11, which are exposed through the hole H, by performing a selective oxidation process. The insulating pattern 13 may be formed in a semicircular convex shape. The insulating pattern 13 may protrude farther toward the hole H than sidewalls of the second material layers 12. Accordingly, a sidewall of the hole H may be formed to be uneven due to the sidewalls of the insulating patterns 13 and the sidewalls of the second material layers 12.

Figure 4C:
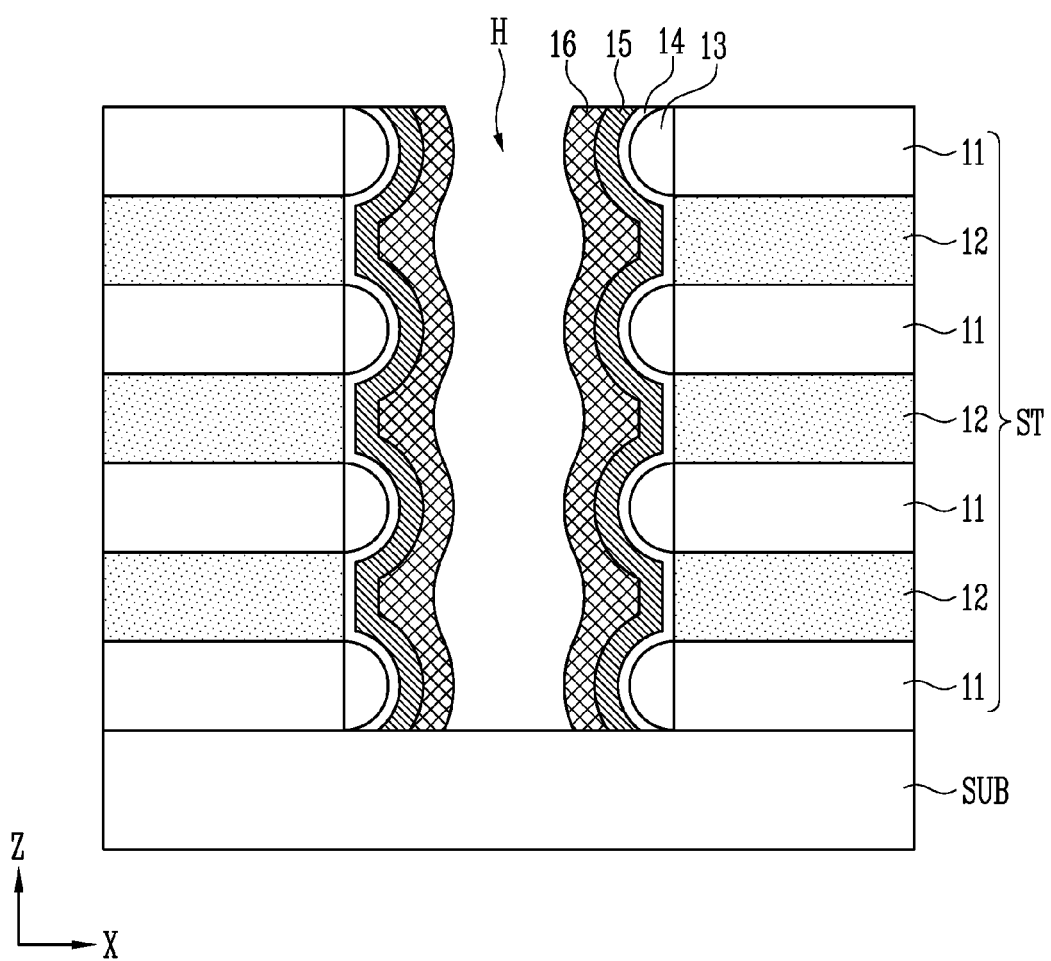

Referring to FIG. 4C, a gate insulating layer 14, a channel layer 15, and a variable resistance layer 16 may be sequentially formed along the uneven sidewall of the hole H.

The gate insulating layer 14 may be formed of oxide. The channel layer 15 may be formed of poly-silicon. At least one of a phase variation material, a perovskite-based material, and a transition metal oxide, such as $NiO_x$, $HfO_x$, $TaO_x$, $TiO_x$, or $SiHfO_x$, may be used for the variable resistance layer 16.

Since the channel layer 15 is formed along the uneven sidewall of the hole H, some regions of the channel layer 15 may be convexly formed in relation to a central portion of the hole H, and a region between the convexly formed regions may be relatively concavely formed in relation to the central portion of the hole H. For example, the region of the channel layer 15, which is adjacent to the first material layer 11 and the insulating pattern 13, may be defined as a convex region, and the region of the channel layer 15, which is adjacent to the second material layer 12, may be defined as a concave region.

Figure 4D:
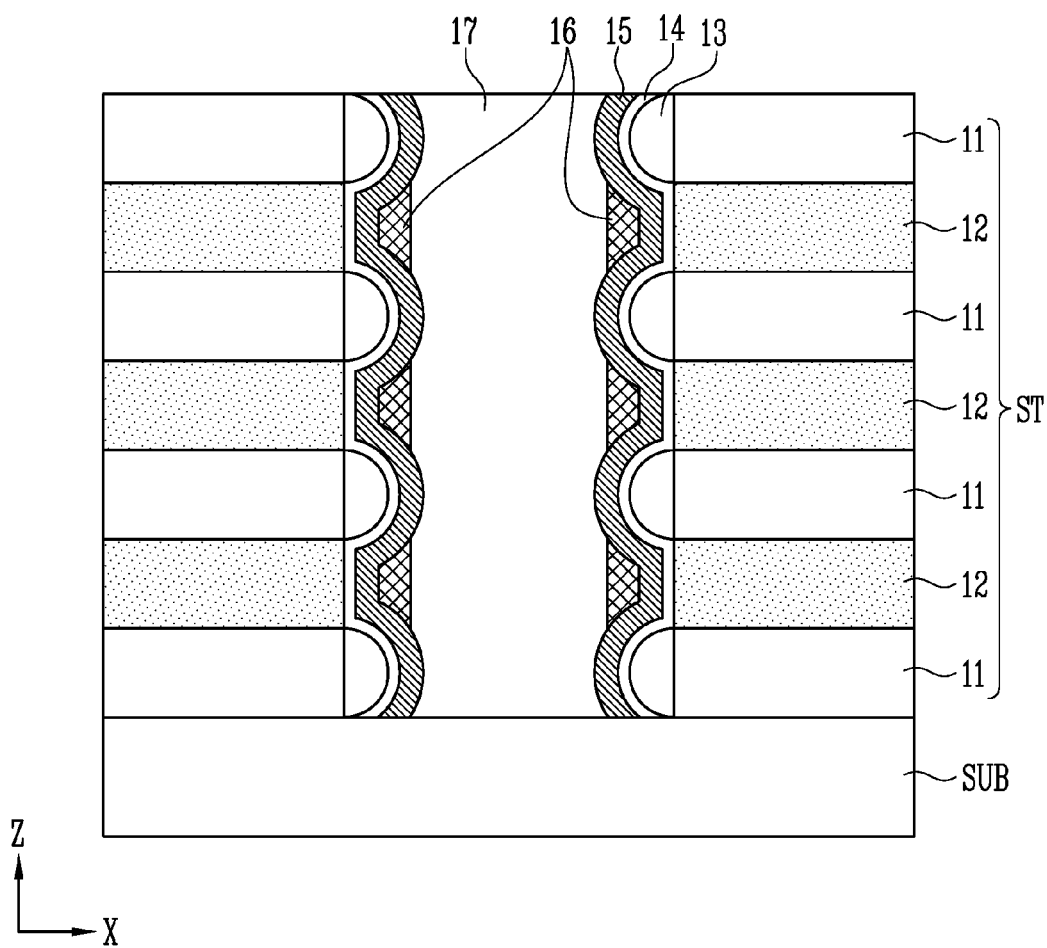

Referring to FIG. 4D, an etching process is performed, in which a portion of the variable resistance layer 16 is etched such that a portion of the channel layer 15 of the convex region is exposed. The variable resistance layer 16 may remain on the concave region of the channel layer 15. The variable resistance layer 16 may be formed as a plurality of patterns that are spaced apart from each other due to the channel layer 15 of the convex regions. That is, each of the plurality of patterned variable resistance layers 16 may remain on the concave region of the channel layer 15, which is adjacent to the second material layer 12, and the plurality of patterned variable resistance layers 16 may be spaced apart from each other in the second direction Z due to the convex regions of the channel layer 15 that are adjacent to the first material layers 11.

Figure 4E:
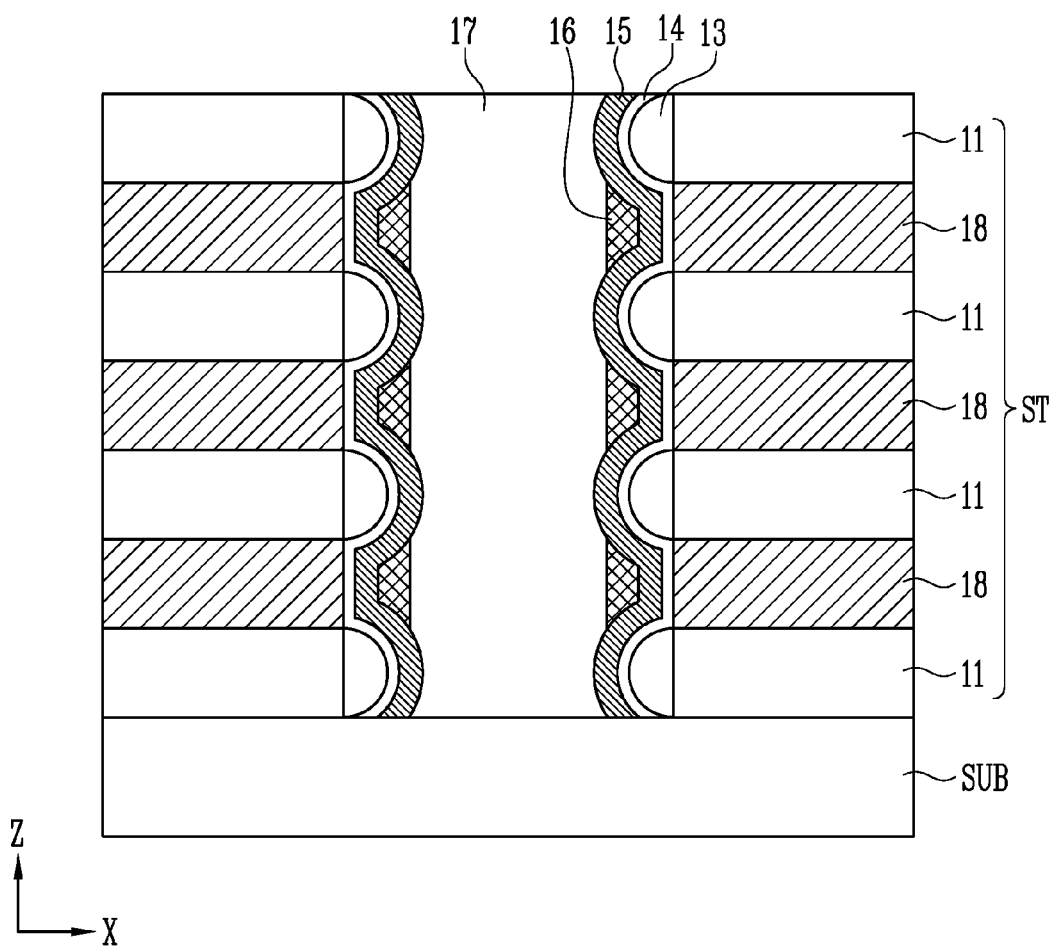

Referring to FIG. 4E, a vertical insulating layer 17 may be formed such that the inside of the hole is buried. The vertical insulating layer 17 may be formed of oxide.

Subsequently, the second material layers (12 shown in FIG. 4B) may be replaced with third material layers 18. In an example, when the second material layers 12 include a sacrificial material and the first material layers 11 include an insulating material, the second material layers 12 may be replaced with conductive layers. The third material layer 18 may include a conductive material, such as poly-silicon, tungsten, molybdenum, or metal. In an example, sidewalls of the first and second material layers 11 and 12 may be exposed through the forming of a slit, and the second material layers 12 that are exposed through the slit may be removed. Subsequently, spaces in which the second material layers 12 are removed may be filled with the third material layers 18.

In another example, when the first material layers 11 include an insulating material and the second material layers 12 include a conductive material, the process of replacing the second material layers 12 with the third material layers 18 may be skipped.

FIGS. 5A to 5F are sectional views illustrating a manufacturing method of the resistive memory device in accordance with another embodiment of the present disclosure.

Figure 5A:
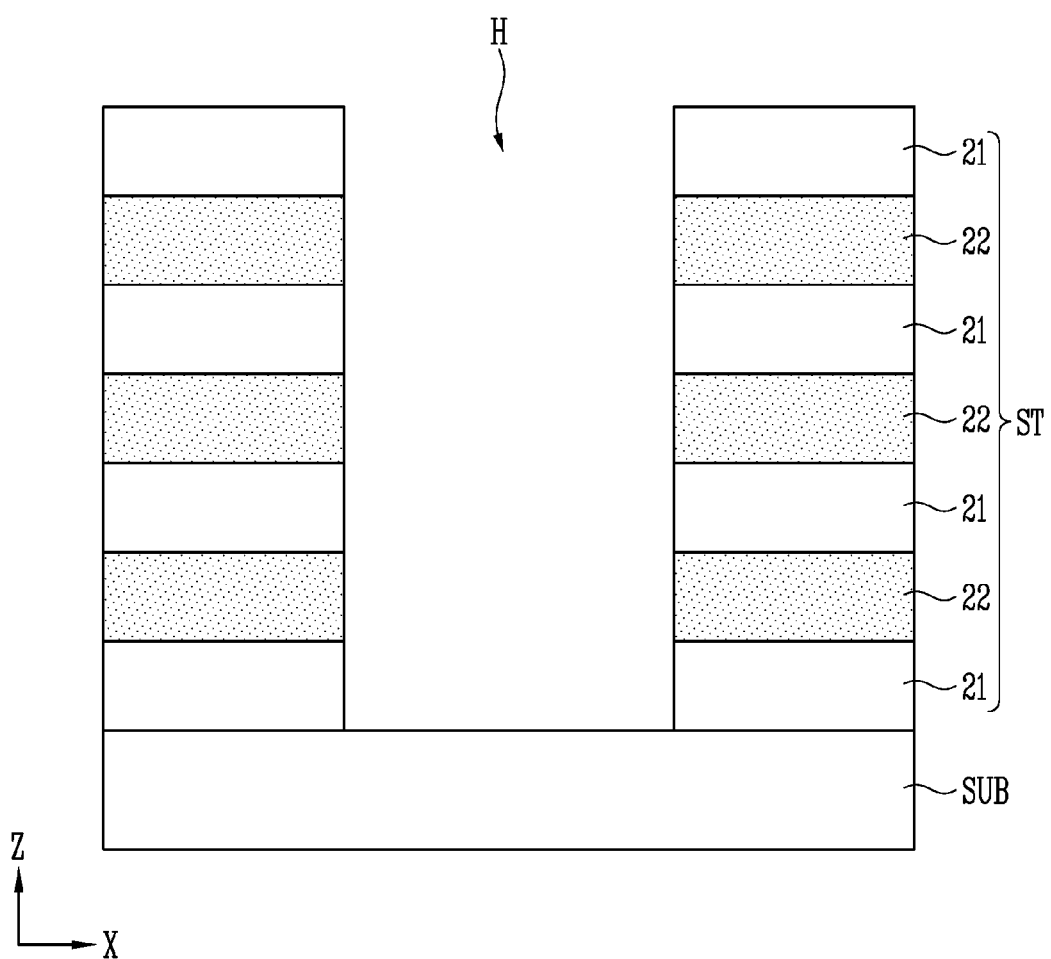
FIGS. 5A to 5F are sectional views illustrating a manufacturing method of the resistive memory device in accordance with another embodiment of the present disclosure.

Referring to FIG. 5A, a stack structure ST may be formed on a substrate SUB. The stack structure ST may include first material layers 21 and second material layers 22, which are alternately stacked. The first and second material layers 21 and 22 may extend in a first direction X, the first direction X extending in a direction horizontal to the substrate SUB. The first and second material layers 21 and 22 may be stacked in a second direction Z, the second direction Z being perpendicular to the substrate SUB. The first and second material layers 21 and 22 may be formed through a deposition process, such as Chemical Vapor Deposition (CVD).

The first material layers 21 may include a material having a high etch selectivity with respect to the second material layers 22. In an example, the first material layers 21 may include an insulating material, such as oxide, and the second material layers 22 may include a sacrificial material, such as nitride. In another example, the first material layers 21 may include an insulating material, such as oxide, and the second material layers 22 may include a conductive material, such as poly-silicon, tungsten, molybdenum or metal.

Subsequently, a hole H may be formed, which penetrates the stack structure ST. The hole H may have a cylindrical shape extending in the second direction Z.

Figure 5B:
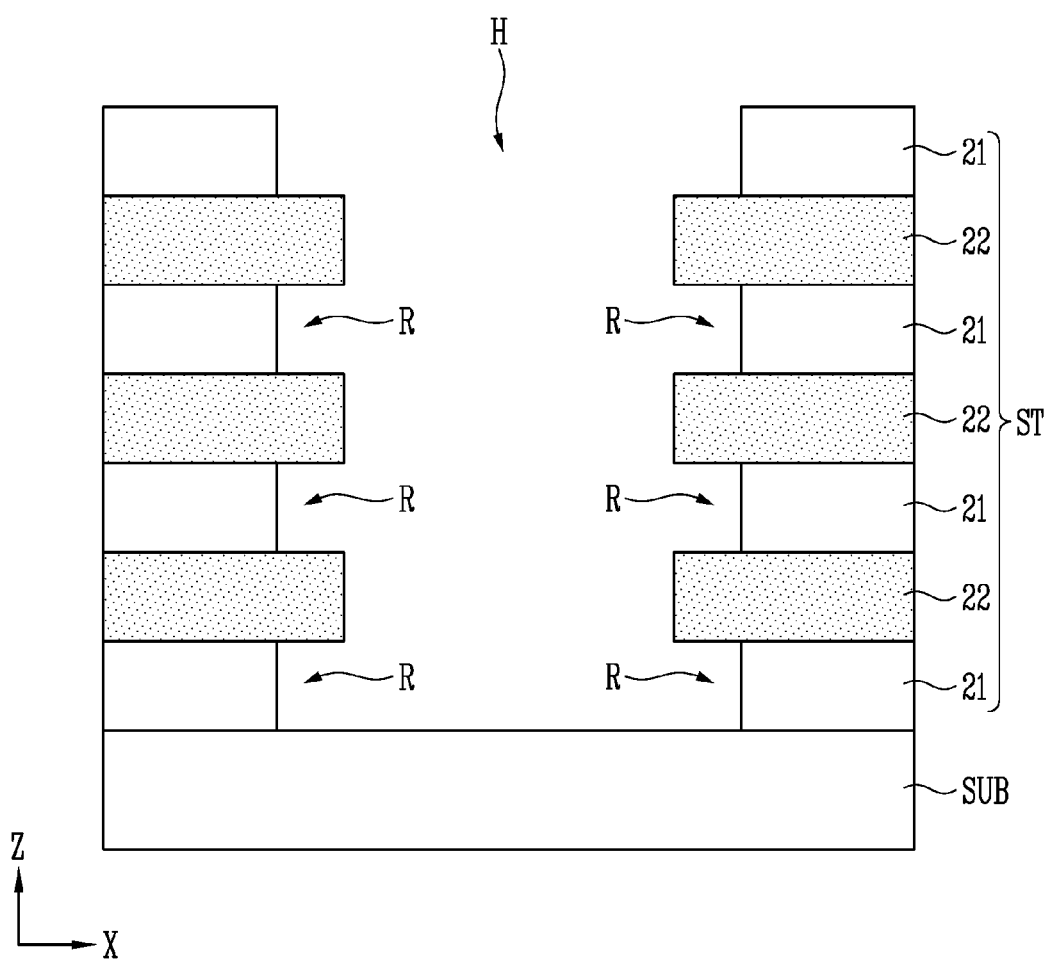

Referring to FIG. 5B, recessed regions R may be formed by etching the first material layers 21 that are exposed through the hole to a certain horizontal depth, the depth measured in a horizontal direction. That is, sidewalls of the first material layers 21 may be etched to a certain depth such that the second material layers 22 protrude farther in the horizontal direction than the first material layers 21.

Figure 5C:
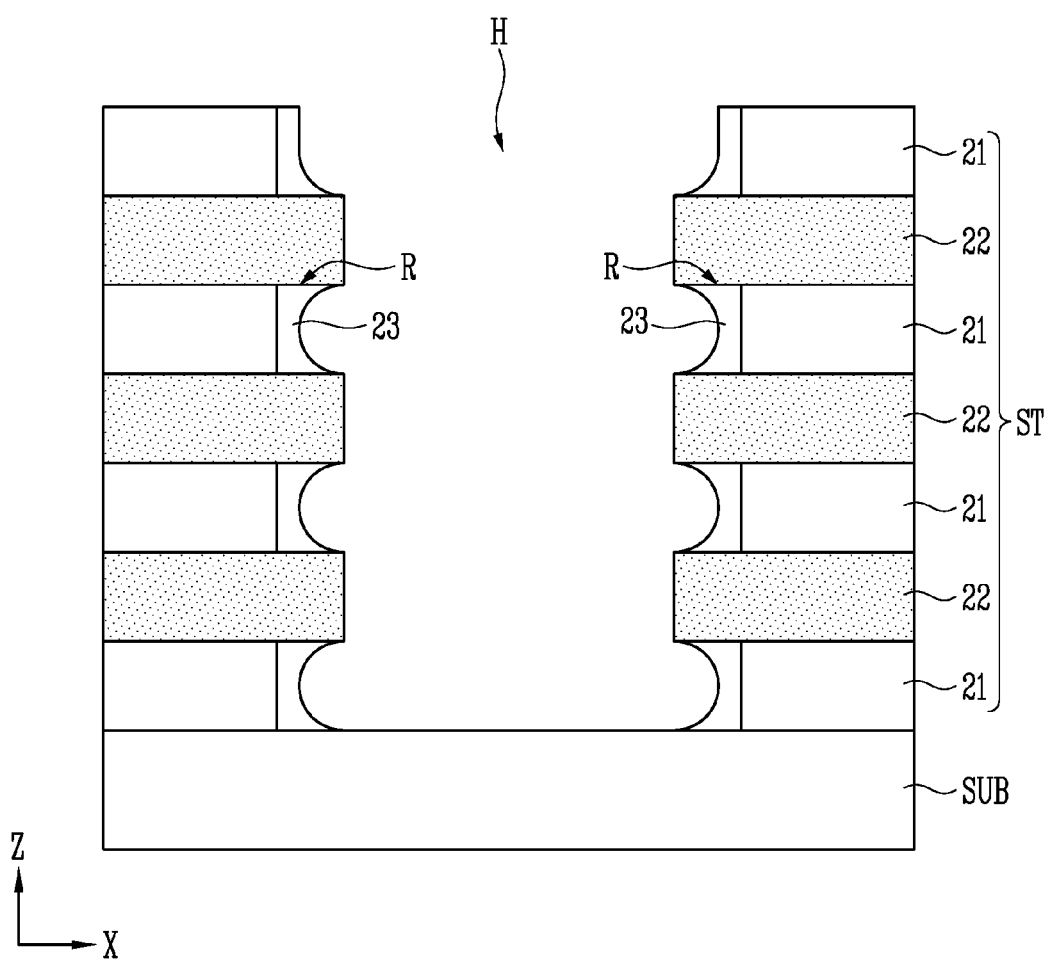

Referring to FIG. 5C, a seed pattern 23 may be formed in the recessed regions R. For example, the seed pattern 23 may be formed by forming a poly-silicon layer along surfaces of the hole H and the recessed regions R and allowing the poly-silicon layer only in the recessed regions R through an etching process.

Figure 5D:
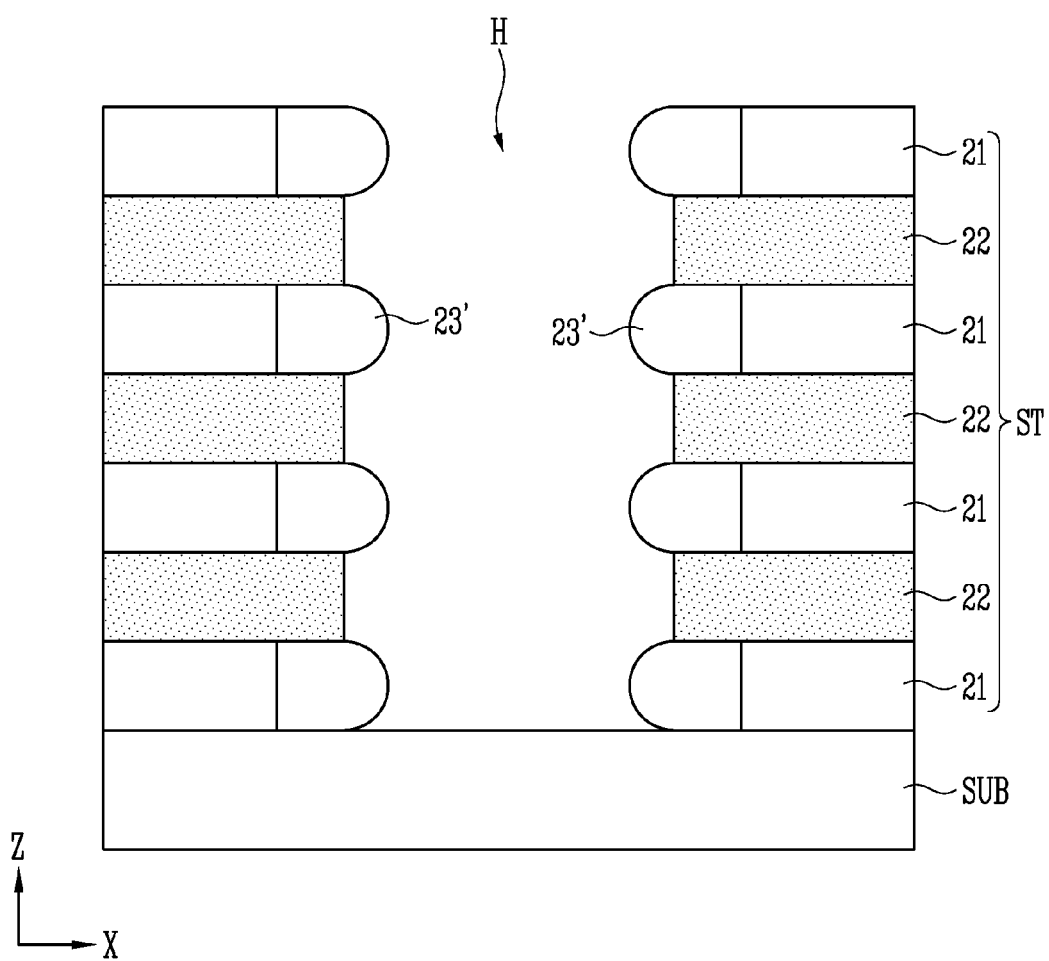

Referring to FIG. 5D, an insulating pattern 23' is formed by oxidizing the seed pattern. The insulating pattern 23' may be preferably formed to protrude farther than sidewalls of adjacent second material layers 22. The surface of a sidewall of the insulating pattern 23', which protrudes farther than the sidewalls of the second material layers 22, may have a round shape. Accordingly, a sidewall of the hole H may be formed to be uneven due to the protruding sidewall of the insulating pattern 23' and the sidewalls of the second material layers 22.

Figure 5E:
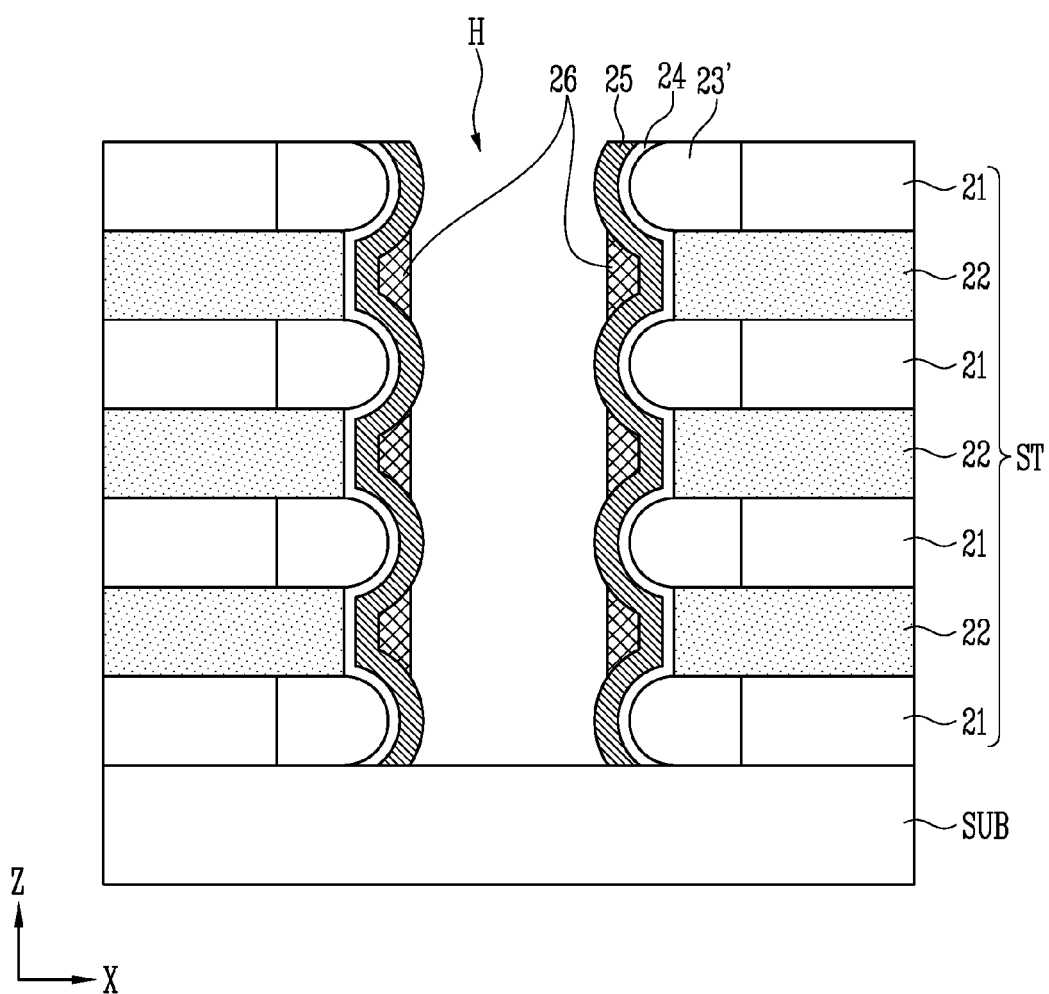

Referring to FIG. 5E, a gate insulating layer 24, a channel layer 25, and a variable resistance layer 26 may be sequentially formed along the uneven sidewall of the hole H.

The gate insulating layer 24 may be formed of oxide. The channel layer 25 may be formed of poly-silicon. At least one of a phase variation material, a perovskite-based material, and a transition metal oxide such as $NiO_x$, $HfO_x$, $TaO_x$, $TiO_x$, or $SiHfO_x$, may be used for the variable resistance layer 26.

Since the channel layer 25 is formed along the uneven sidewall of the hole H, some regions of the channel layer 25 may be convexly formed in relation to a central portion of the hole H, and a region between the convexly formed regions may be relatively concavely formed in relation to the central portion of the hole H. For example, the region of the channel layer 25, which is adjacent to the first material layer 21 and the insulating pattern 23', may be defined as a convex region, and the region of the channel layer 25, which is adjacent to the second material layer 22, may be defined as a concave region.

Subsequently, an etching process is performed, in which a portion of the variable resistance layer 26 is etched such that a portion of the convex region of the channel layer 25 is exposed. The variable resistance layer 26 may remain on the concave region of the channel layer 25. The variable resistance layer 26 may be formed as a plurality of patterns that are spaced apart from each other due to the convex regions of the channel layer 25. That is, each of the plurality of patterned variable resistance layers 26 may remain on the concave region of the channel layer 25, which is adjacent to the second material layer 22, and the plurality of patterned variable resistance layers 26 may be spaced apart from each other in the second direction Z due to the convex regions of the channel layer 25, which are adjacent to the first material layers 21 and the insulating patterns 23'.

Figure 5F:
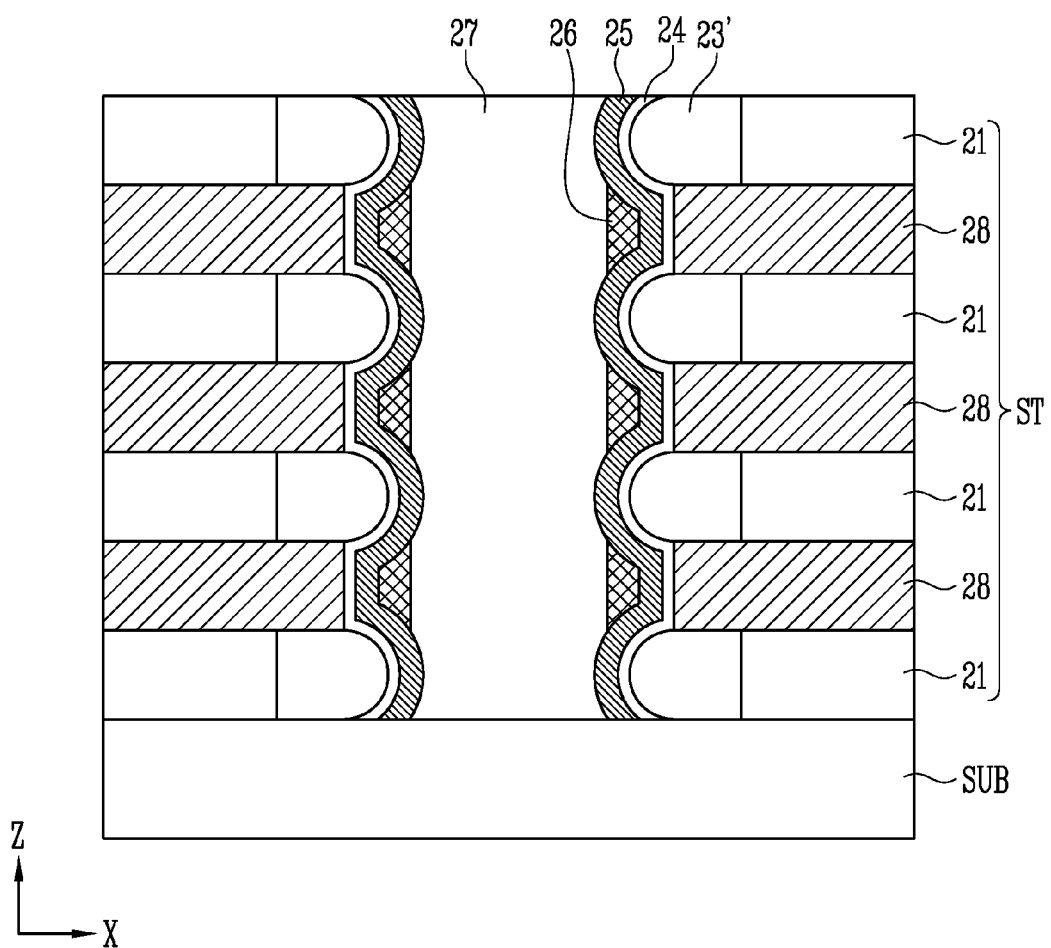

Referring to FIG. 5F, a vertical insulating layer 27 may be formed such that the inside of the hole is buried. The vertical insulating layer 27 may be formed of oxide.

Subsequently, the second material layers (22 shown in FIG. 5E) may be replaced with third material layers 28. In an example, when the second material layers 22 include a sacrificial material and the first material layer 21 include an insulating material, the second material layers 22 may be replaced with conductive layers. The third material layer 28 may include a conductive material, such as poly-silicon, tungsten, molybdenum or metal.

In another example, when the first material layers 21 include an insulating material and the second material layers 22 include a conductive material, the process of replacing the second material layers 22 with the third material layers 28 may be skipped.

Figure 6:
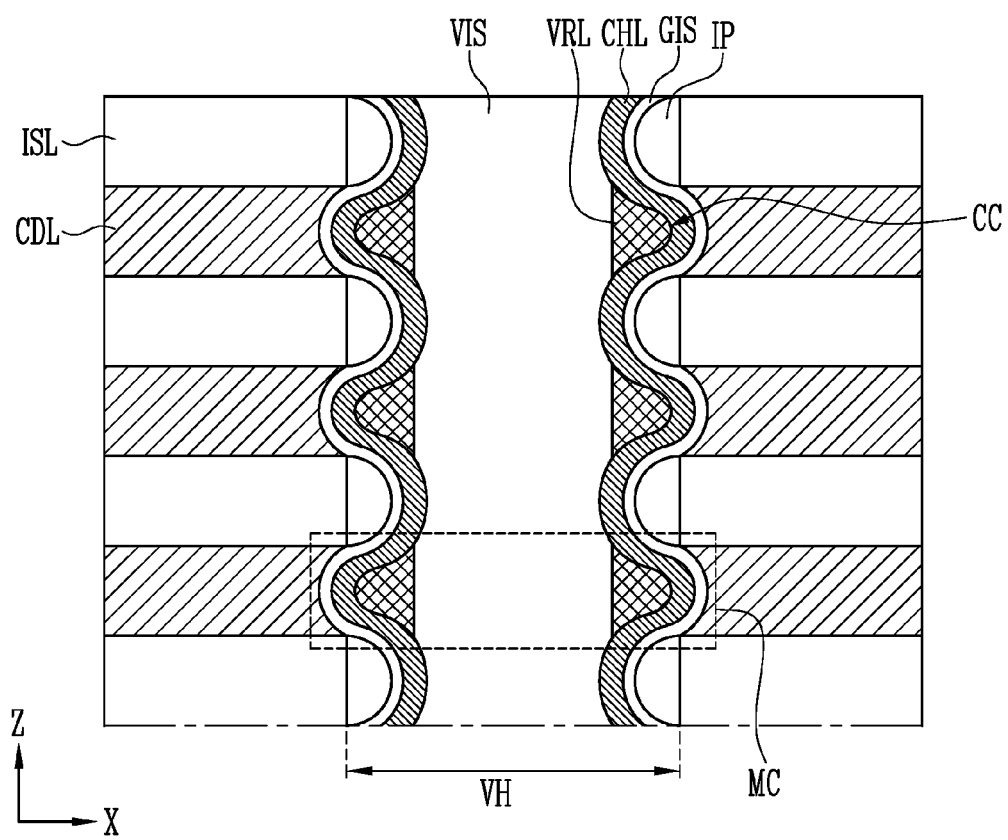
FIG. 6 is a sectional view illustrating a resistive memory device in accordance with another embodiment of the present disclosure.

FIG. 6 is a sectional view illustrating a resistive memory device in accordance with another embodiment of the present disclosure.

Referring to FIG. 6, the resistive memory device may include memory blocks including a plurality of resistive random access memory cells, and a portion of a string that is included in a memory block is illustrated in FIG. 6.

The string may include a plurality of resistive random access memory cells MC, and the plurality of resistive random access memory cells MC may be connected to conductive layers CDL that correspond to word lines. Interlayer insulating layers ISL may be formed between the conductive layers CDL. The conductive layers CDL and the interlayer insulating layers ISL may extend in an X direction, the X direction extending in a direction that is parallel to a substrate. For example, the interlayer insulating layers ISL and the conductive layers CDL may be alternately stacked on the top of a lower structure (not shown). The lower structure may include the substrate or at least one of a source line, a source select line, and peripheral circuits, which are formed on the substrate. The conductive layers CDL may be used as word lines or select lines. For example, when assuming that the interlayer insulating layers ISL and the conductive layers CDL are alternately stacked on the substrate, the conductive layers CDL may include word lines and drain select lines. The interlayer insulating layers ISL may be formed of oxide, and the conductive layers CDL may be formed of a metal material, such as tungsten.

A vertical hole VH penetrating the interlayer insulating layers ISL and the conductive layers CDL in a Z direction, the Z direction being perpendicular to the substrate, may be formed in the string, and an insulating pattern IP having a semicircular shape may be disposed on each of sidewalls of the interlayer insulating layers ISL, which are adjacent to the vertical hole VH. Sidewalls of the conductive layers CDL, which are adjacent to the vertical hole VH, may be concavely formed. Accordingly, a sidewall of the vertical hole VH may be uneven due to the interlayer insulating layers ISL protruding based on the semicircular shape of the insulating pattern IP, resulting in convex sidewalls, and the conductive layers CDL having concave sidewalls. A gate insulating layer GIS, a channel layer CHL, a variable resistance layer VRL, and a vertical insulating layer VIS may be formed inside the vertical hole VH. For example, the vertical hole VH may be formed in a cylindrical shape, the insulating pattern IP may be disposed on each of the sidewalls of the interlayer insulating layers ISL in an inner wall of the vertical hole VH, and the gate insulating layer GIS and the channel layer CHL may be formed along sidewalls of the conductive layers CDL and sidewalls of the insulating patterns IP. The channel layer CHL may have concave portions in regions that are adjacent to the conductive layers CDL and convex portions in regions that are adjacent to the interlayer insulating layers ISL due to the insulating pattern IP that is disposed on the sidewall of each of the interlayer insulating layers ISL and the conductive layers having the concave sidewalls. The variable resistance layers VRL may be disposed at the concave portions of the channel layer CHL. That is, the variable resistance layers VRL may be formed at the concave portions CC of the channel layer CHL, which are adjacent to the conductive layers CDL, and adjacent variable resistance layers VRL may be physically spaced apart from each other due to the convex portions of the channel layer CHL. The vertical insulating layer VIS may be formed at a core portion of the vertical hole VH.

In this embodiment, the variable resistance layer VRL may be used as a layer for storing data, and the channel layer CHL may be used to allow a current to flow in the string.

The gate insulating layer GIS and the vertical insulating layer VIS may be formed of oxide. The channel layer CHL may be formed of poly-silicon. At least one of a phase variation material, a perovskite-based material, and a transition metal oxide such as $NiO_x$, $HfO_x$, $TaO_x$, $TiO_x$, or $SiHfO_x$, may be used for the variable resistance layer VRL.

FIGS. 7A to 7D are sectional views illustrating a manufacturing method of the resistive memory device in accordance with still another embodiment of the present disclosure.

Figure 7A:
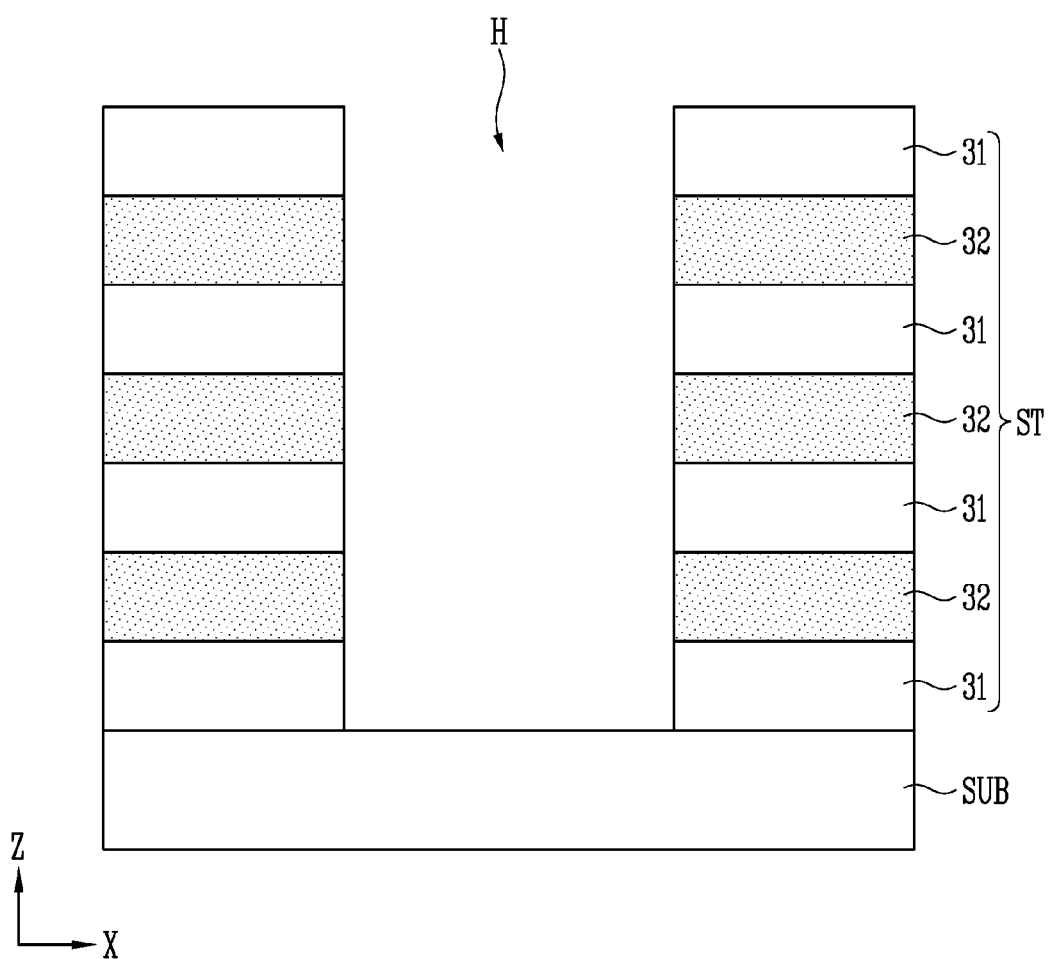
FIGS. 7A to 7D are sectional views illustrating a manufacturing method of the resistive memory device in accordance with still another embodiment of the present disclosure.

Referring to FIG. 7A, a stack structure ST may be formed on a substrate SUB. The stack structure ST may include first material layers 31 and second material layers 32, which are alternately stacked. The first and second material layers 31 and 32 may extend in a first direction X, the first direction X extending in a direction that is horizontal to the substrate SUB. The first and second material layers 31 and 32 may be stacked in a second direction Z, the second direction Z being perpendicular to the substrate SUB. The first and second material layers 31 and 32 may be formed by using a deposition process, such as Chemical Vapor Deposition (CVD).

The first material layers 31 may include a material having a high etch selectivity with respect to the second material layers 32. In an example, the first material layers 31 may include an insulating material, such as oxide, and the second material layers 32 may include a sacrificial material, such as nitride. In another example, the first material layers 31 may include an insulating material, such as oxide, and the second material layers 32 may include a conductive material, such as poly-silicon, tungsten, molybdenum, or metal.

Subsequently, a hole H may be formed, which penetrates the stack structure ST. The hole H may have a cylindrical shape extending in the second direction Z.

Figure 7B:
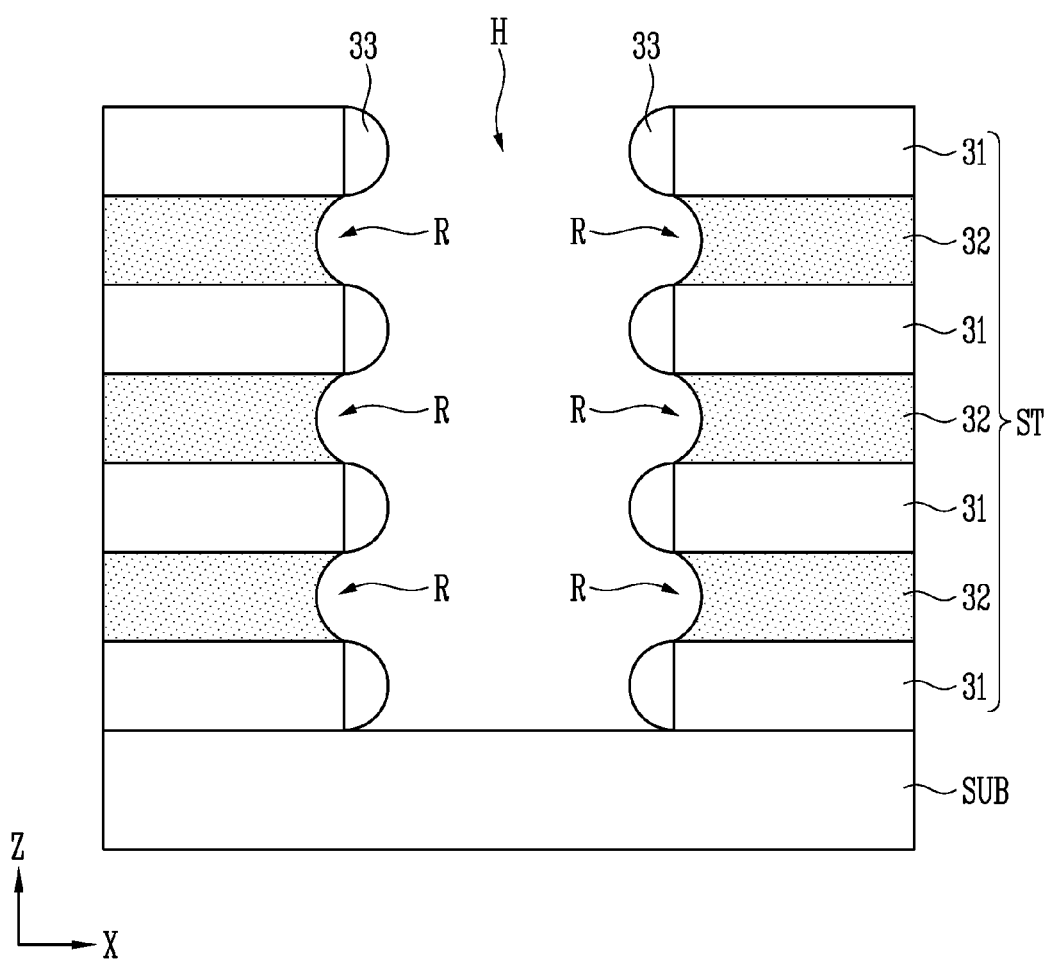

Referring to FIG. 7B, an insulating pattern 33 may be formed on each of sidewalls of the first material layers 31, which are exposed through the hole H, by performing a selective oxidation process. The insulating pattern 33 may be formed in a semicircular convex shape. The insulating pattern 33 may protrude farther toward the hole H than sidewalls of the second material layers 32.

Subsequently, recessed regions R may be formed by etching the exposed sidewalls of the second material layers 32 to a certain depth. That is, the sidewalls of the second material layers 32 may be etched to a certain depth such that the first material layers 31 protrude farther in a horizontal direction than the second material layers 32. The sidewalls of the second material layers 32 may be concavely etched in a round shape.

Accordingly, a sidewall of the hole H may be formed to be uneven due to the sidewalls of the insulating patterns 33 and the sidewalls of the second material layers 32.

In the embodiment of the present disclosure, it is described that the sidewalls of the second material layers 32 are etched after the insulating pattern 33 is formed. However, the insulating pattern 33 may be formed on each of the sidewalls of the first material layers 31 after the sidewalls of the second material layers 32 are etched.

Figure 7C:
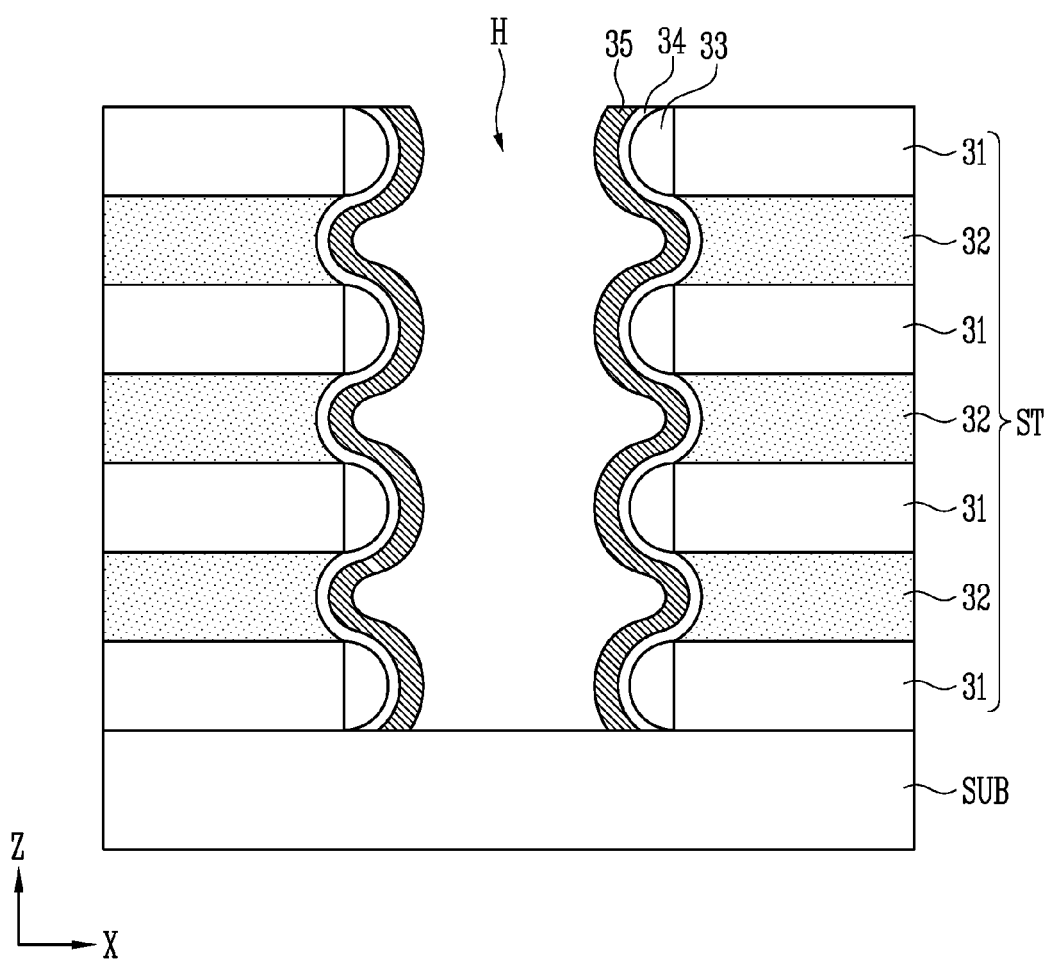

Referring to FIG. 7C, a gate insulating layer 34 and a channel layer 35 may be sequentially formed along the uneven sidewall of the hole H.

The gate insulating layer 34 may be formed of oxide. The channel layer 35 may be formed of poly-silicon.

Since the channel layer 35 is formed along the uneven sidewall of the hole H, some regions of the channel layer 35 may be convexly formed in relation to a central portion of the hole H, and a region between the convexly formed regions may be relatively concavely formed in relation to the central portion of the hole H. For example, the region of the channel layer 35, which is adjacent to the first material layer 31 and the insulating pattern 33, may be defined as a convex region, and the region of the channel layer 35, which is adjacent to the second material layer 32, may be defined as a concave region.

Figure 7D:
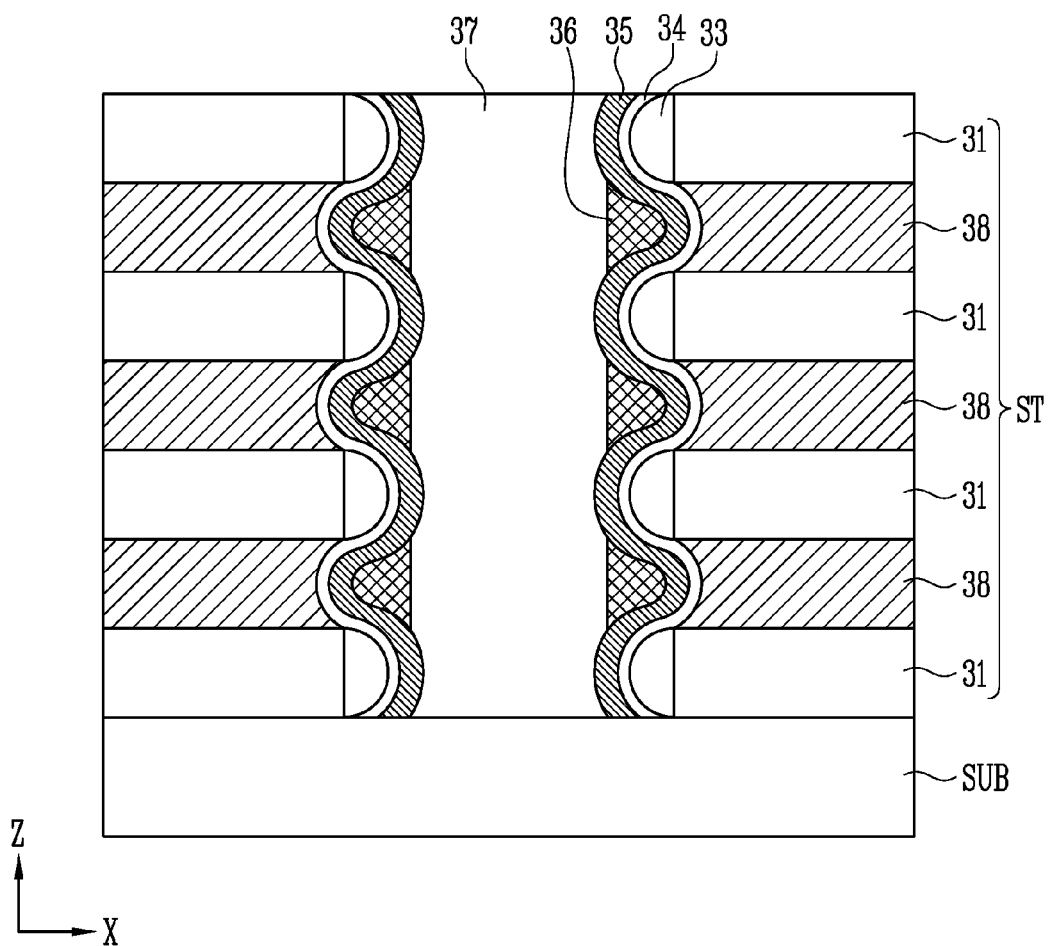

Referring to FIG. 7D, a variable resistance layer 36 may be formed along a surface of the channel layer 35. At least one of a phase variation material, a perovskite-based material, and a transition metal oxide, such as $NiO_x$, $HfO_x$, $TaO_x$, $TiO_x$, or $SiHfO_x$, may be used for the variable resistance layer 36.

Subsequently, an etching process may be performed, in which a portion of the variable resistance layer 36 is etched such that a portion of the channel layer 35 of the convex region is exposed. The variable resistance layer 36 may remain on the concave region of the channel layer 35. The variable resistance layer 36 may be formed as a plurality of patterns that are spaced apart from each other due to the channel layer 35 of the convex regions. That is, each of the plurality of patterned variable resistance layers 36 may remain on the concave region of the channel layer 35, which is adjacent to the second material layer 32, and the plurality of patterned variable resistance layers 36 may be spaced apart from each other in the second direction Z due to the convex regions of the channel layer 35, which are adjacent to the first material layers 31.

Subsequently, a vertical insulating layer 37 may be formed such that the inside of the hole is buried. The vertical insulating layer 37 may be formed of oxide.

Subsequently, the second material layers (32 shown in FIG. 7C) may be replaced with third material layers 38. In an example, when the second material layers 32 include a sacrificial material and the first material layer 31 include an insulating material, the second material layers 32 may be replaced with conductive layers. The third material layer 38 may include a conductive material such as poly-silicon, tungsten, molybdenum, or metal.

In another example, when the first material layers 31 include an insulating material and the second material layers 32 include a conductive material, the process of replacing the second material layers 32 with the third material layers 38 may be skipped.

FIGS. 8A to 8G are sectional views illustrating a manufacturing method of the resistive memory device in accordance with still another embodiment of the present disclosure.

Figure 8A:
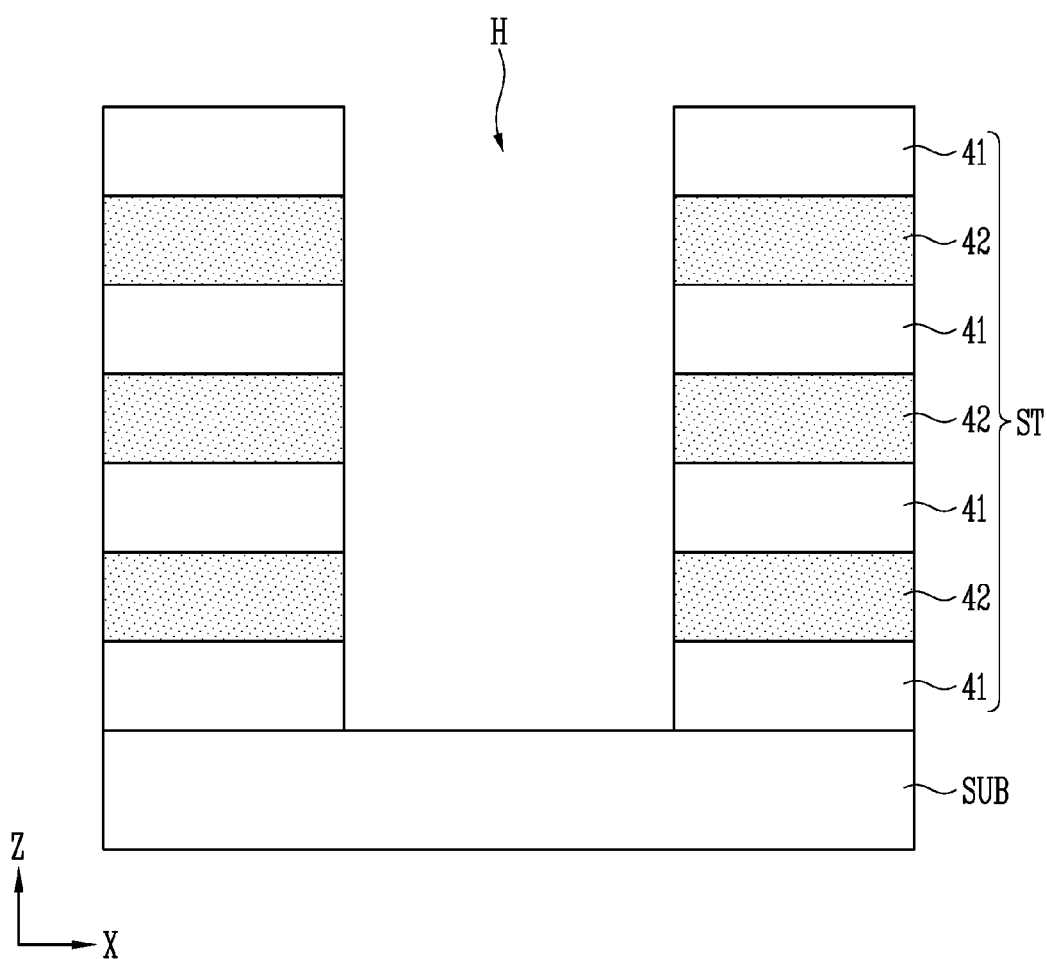
FIGS. 8A to 8G are sectional views illustrating a manufacturing method of the resistive memory device in accordance with still another embodiment of the present disclosure.

Referring to FIG. 8A, a stack structure ST may be formed on a substrate SUB. The stack structure ST may include first material layers 41 and second material layers 42, which are alternately stacked. The first and second material layers 41 and 42 may extend in a first direction X as a direction horizontal to the substrate SUB. The first and second material layers 41 and 42 may be stacked in a second direction Z, the second direction Z being perpendicular to the substrate SUB. The first and second material layers 41 and 42 may be formed through a deposition process, such as Chemical Vapor Deposition (CVD).

The first material layers 41 may include a material having a high etch selectivity with respect to the second material layers 42. In an example, the first material layers 41 may include an insulating material, such as oxide, and the second material layers 42 may include a sacrificial material, such as nitride. In another example, the first material layers 41 may include an insulating material, such as oxide, and the second material layers 42 may include a conductive material such as poly-silicon, tungsten, molybdenum, or metal.

Subsequently, a hole H may be formed, which penetrates the stack structure ST. The hole H may have a cylindrical shape that extends in the second direction Z.

Figure 8B:
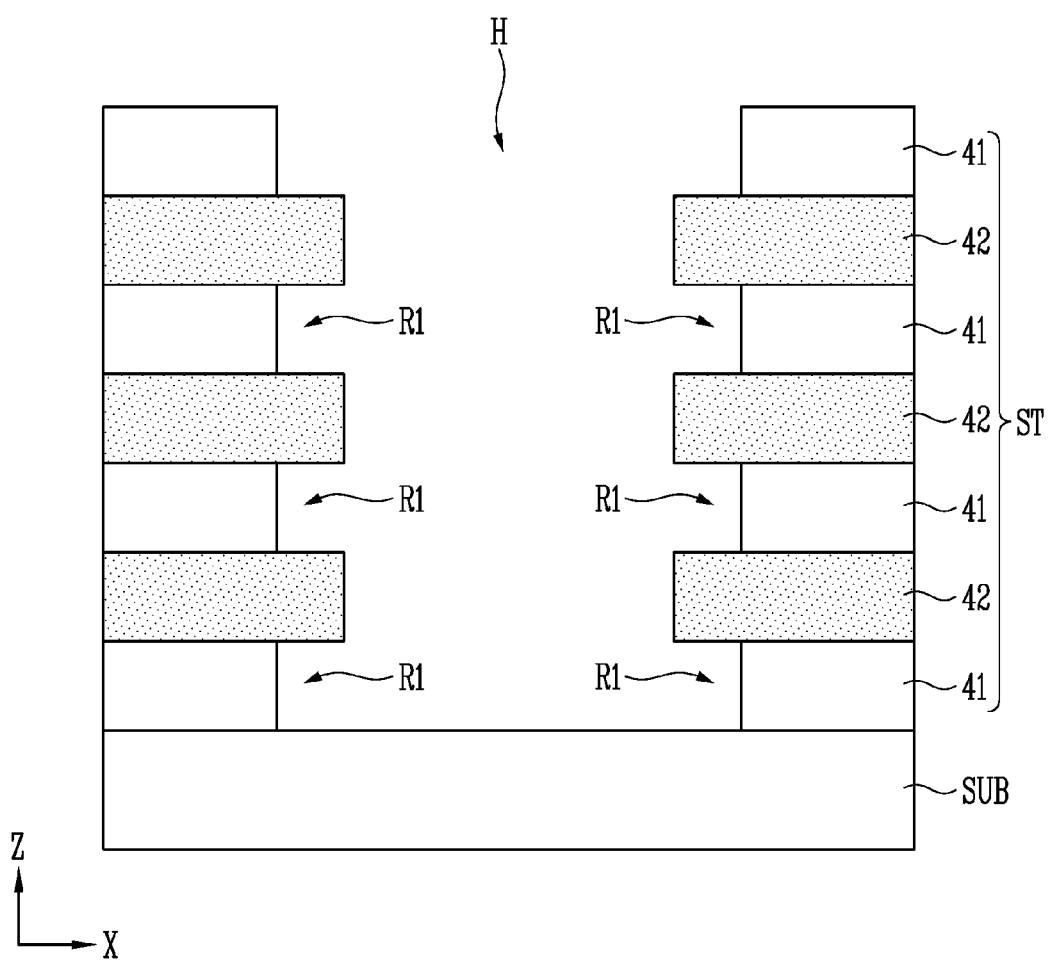

Referring to FIG. 8B, first recessed regions R1 are formed by etching the first material layers 41 that are exposed through the hole H to a certain depth in a horizontal direction. That is, sidewalls of the first material layers 41 may be etched to a certain depth such that the second material layers 42 protrude farther in the horizontal direction than the first material layers 41.

Figure 8C:
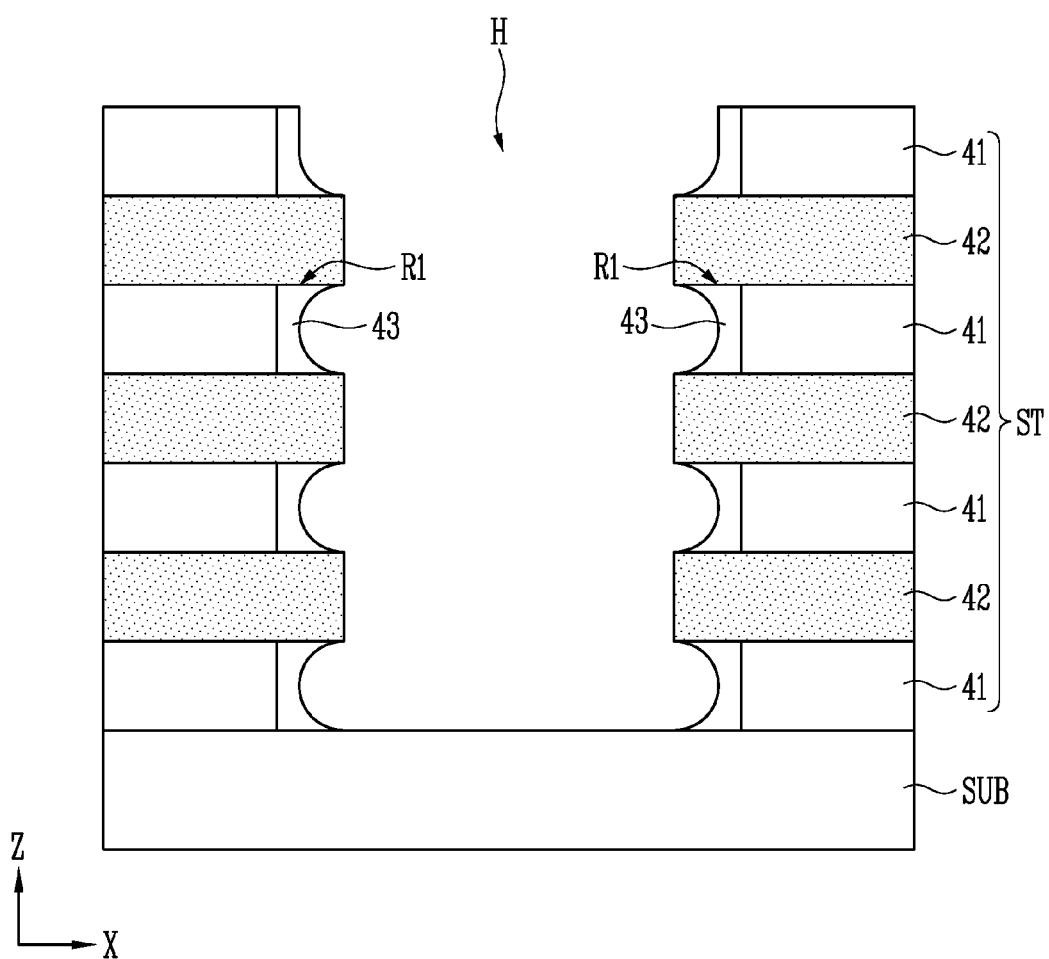

Referring to FIG. 8C, a seed pattern 43 may be formed in the first recessed regions R1. For example, the seed pattern 43 may be formed by forming a poly-silicon layer along surfaces of the hole H and the first recessed regions R1 and allowing the poly-silicon layer only in the first recessed regions R1 through an etching process.

Figure 8D:
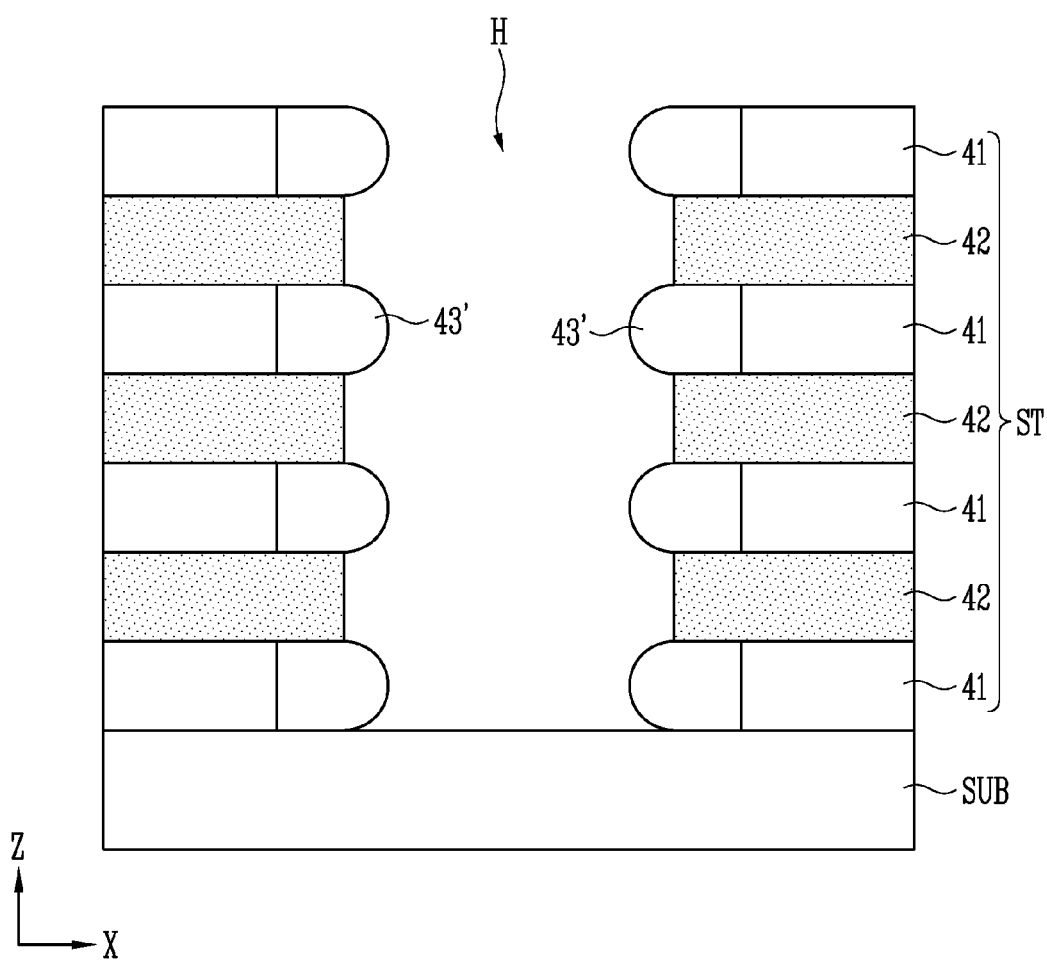

Referring to FIG. 8D, an insulating pattern 43' may be formed by oxidizing the seed pattern. The insulating pattern 43' may be preferably formed to protrude farther than sidewalls of adjacent second material layers 42. The surface of a sidewall of the insulating pattern 43, which protrudes farther than the sidewalls of the second material layers 42, may have a round shape.

Figure 8E:
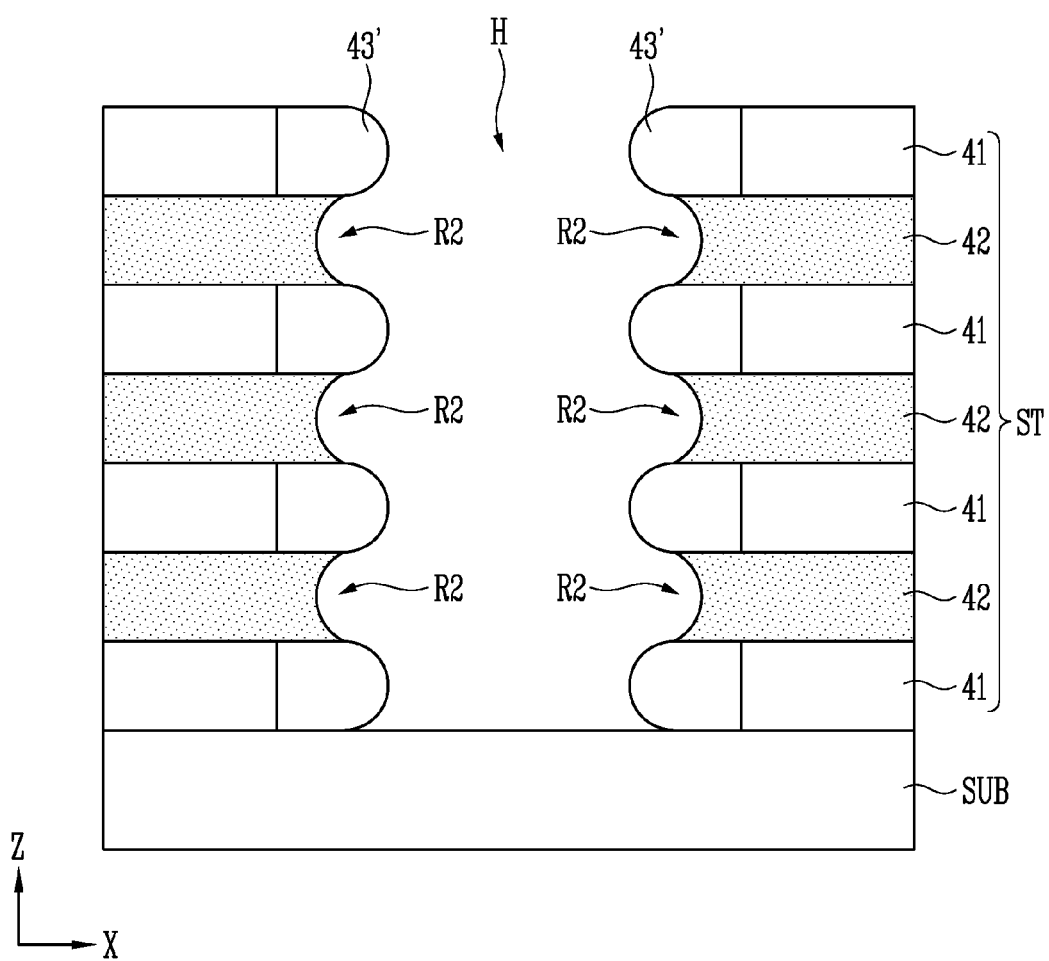

Referring to FIG. 8E, second recessed regions R2 may be formed by etching the exposed sidewalls of the second material layers 42 to a certain depth. The sidewalls of the second material layers 42 may be concavely etched in a round shape.

Accordingly, a sidewall of the hole H may be formed to be uneven due to sidewalls of the insulating patterns 43' and the sidewalls of the second material layers 42.

Figure 8F:
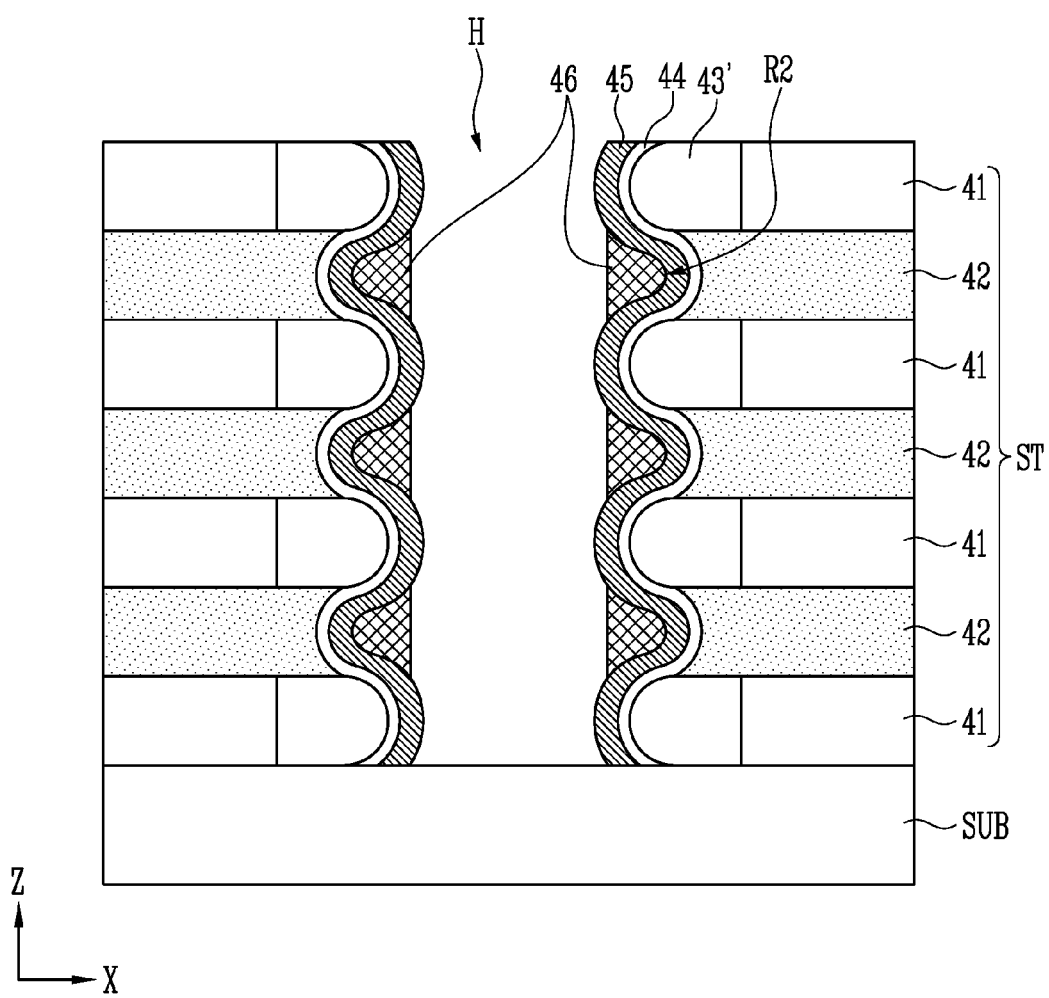

Referring to FIG. 8F, a gate insulating layer 44, a channel layer 45, and a variable resistance layer 46 may be sequentially formed along the uneven sidewall of the hole H.

The gate insulating layer 44 may be formed of oxide. The channel layer 45 may be formed of poly-silicon. At least one of a phase variation material, a perovskite-based material, and a transition metal oxide such as $NiO_x$, $HfO_x$, $TaO_x$, $TiO_x$, or $SiHfO_x$, may be used for the variable resistance layer 46.

Since the channel layer 45 is formed along the uneven sidewall of the hole H, some regions of the channel layer 45 may be convexly formed in relation to a central portion of the hole H, and a region between the convexly formed regions may be relatively concavely formed in relation to the central portion of the hole H. For example, the region of the channel layer 45, which is adjacent to the first material layer 41 and the insulating pattern 43', may be defined as a convex region, and the region of the channel layer 45, which is adjacent to the second material layer 42, may be defined as a concave region.

Subsequently, an etching process may be performed, in which a portion of the variable resistance layer 46 is etched such that a portion of the channel layer 45 of the convex region is exposed. The variable resistance layer 46 may remain on the concave region of the channel layer 45. The variable resistance layer 46 may be formed as a plurality of patterns that are spaced apart from each other due to the channel layer 45 of the convex regions. That is, each of the plurality of patterned variable resistance layers 46 may remain on the concave region of the channel layer 45, which is adjacent to the second material layer 42, and the plurality of patterned variable resistance layers 46 may be spaced apart from each other in the second direction Z due to the convex regions of the channel layer 45, which are adjacent to the first material layers 41 and the insulating patterns 43'.

Figure 8G:
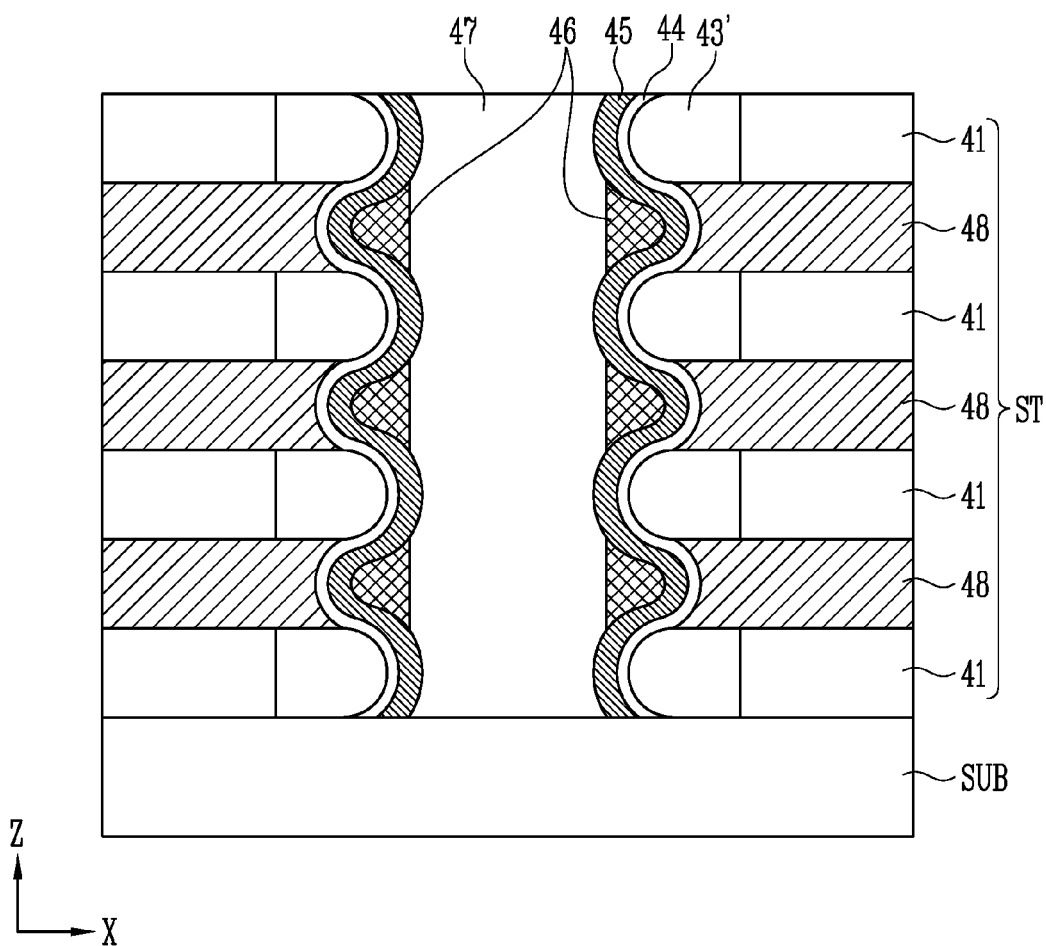

Referring to FIG. 8G, a vertical insulating layer 47 may be formed such that the inside of the hole is buried. The vertical insulating layer 47 may be formed of oxide.

Subsequently, the second material layers (42 shown in FIG. 8F) may be replaced with third material layers 48. In an example, when the second material layers 42 include a sacrificial material and the first material layer 41 include an insulating material, the second material layers 42 may be replaced with conductive layers. The third material layer 48 may include a conductive material, such as poly-silicon, tungsten, molybdenum, or metal.

In another example, when the first material layers 41 include an insulating material and the second material layers 42 include a conductive material, the process of replacing the second material layers 42 with the third material layers 48 may be skipped.

Figure 9:
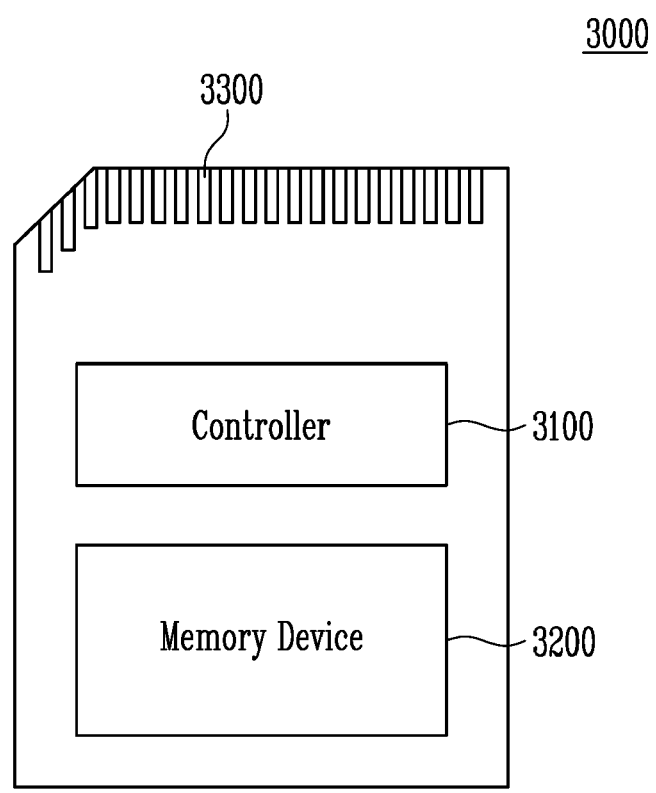
FIG. 9 is a diagram illustrating a memory card system to which the resistive memory device of the present disclosure is applied.

FIG. 9 is a diagram illustrating a memory card system to which the resistive memory device of the present disclosure is applied.

Referring to FIG. 9, the memory card system 3000 may include a controller 3100, a memory device 3200, and a connector 3300.

The controller 3100 may be connected to the memory device 3200. The controller 3100 may access the memory device 3200. For example, the controller 3100 may control a program, read, or erase operation or may control a background operation of the memory device 3200. The controller 3100 may provide an interface between the memory device 3200 and a host. The controller 3100 may drive firmware for controlling the memory device 3200. For example, the controller 3100 may include components, such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. Exemplarily, the controller 3100 may communicate with the external device through at least one of various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 3300 may be defined by at least one of the above-described various communication protocols.

The memory device 3200 may include resistive random access memory cells and may be configured identically to the resistive memory device 1100 shown in FIG. 1.

The controller 3100 and the memory device 3200 may be integrated into a single semiconductor device, to constitute a memory card. For example, the controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 10:
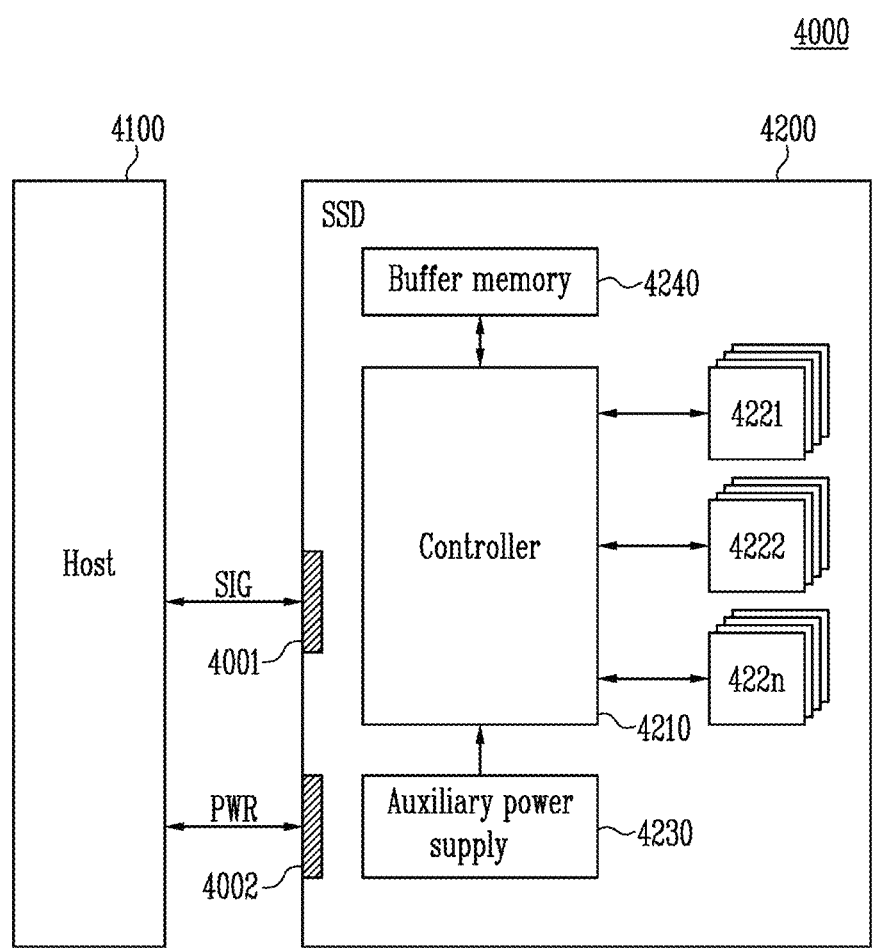
FIG. 10 is a diagram illustrating a Solid State Drive (SSD) system to which the resistive memory device of the present disclosure is applied.

FIG. 10 is a diagram illustrating a Solid State Drive (SSD) system to which the resistive memory device of the present disclosure is applied.

Referring to FIG. 10, the SSD system 4000 may include a host 4100 and an SSD 4200. The SSD 4200 may exchange a signal SIG with the host 4100 through a signal connector 4001 and may receive power PWR through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to a signal that is received from the host 4100. Exemplarily, the signal may be a signal based on an interface between the host 4100 and the SSD 4200. For example, the signal may be a signal that is defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may be configured to store data and may include resistive random access memory cells. Each of the plurality of memory devices 4221 to 422n may be configured identically to the resistive memory device 1100, shown in FIG. 1.

The auxiliary power supply 4230 may be connected to the host 4100 through the power connector 4002. The auxiliary power supply 4230 may receive power PWR that is input from the host 4100 and may charge the power PWR. When the supply of power from the host 4100 is not smooth, the auxiliary power supply 4230 may provide power of the SSD 4200. For example, the auxiliary power supply 4230 may be located in the SSD 4200 or located outside of the SSD 4200. For example, the auxiliary power supply 4230 may be located on a main board and may provide auxiliary power to the SSD 4200.

The buffer memory 4240 may operate as a buffer memory of the SSD 4200. For example, the buffer memory 4240 may temporarily store data that is received from the host 4100 or data that is received from the plurality of memory devices 4221 to 422n or may temporarily store meta data (e.g., a mapping table) of the memory devices 4221 to 422n. The buffer memory 4240 may include volatile memories, such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, a length of a variable resistance layer is formed relatively shorter than an effective channel length of a memory cell, such that a bias used to store in or erase from the resistive memory device can be decreased. Accordingly, operation characteristics of the resistive memory device can be improved. In addition, resistive patterns corresponding to respective memory cells are physically spaced apart from each other, so that interference between the memory cells and a disturbance phenomenon can be reduced.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A method of manufacturing a resistive memory device, the method comprising:
    forming a stack structure in which a plurality of first material layers and a plurality of second material layers are alternately stacked on each other;
    forming a hole that penetrates the stack structure through the plurality of first material layers and the plurality of second material layers;
    forming an uneven sidewall of the hole by forming an insulating pattern on a sidewall of each first material layer of the first material layers, which is exposed through the hole;
    forming a gate insulating layer and a channel layer along the uneven sidewall of the hole, wherein the channel layer includes convex regions, in relation to a central portion of the hole, and concave regions, in relation to the central portion of the hole, between the convex regions; and
    forming variable resistance layers on the concave regions of the channel layer.

2. The method of claim 1, wherein the forming of the variable resistance layers includes:
forming the variable resistance layers along a surface of the channel layer; and
exposing the convex regions of the channel layer by performing an etching process such that the variable resistance layers remain only on the concave regions of the channel layer.

3. The method of claim 1, further comprising forming a vertical insulating layer inside of the hole.

4. The method of claim 1, further comprising removing the second material layer that is exposed through a slit that is penetrating the stack structure and filling a space in which the second material layer is removed with a third material layer after the slit is formed.

5. The method of claim 1, wherein, in the forming of the insulating pattern, the insulating pattern is formed by selectively oxidizing sidewalls of the first material layers, which are exposed through the hole.

6. The method of claim 1, wherein the forming of the insulating pattern includes:
forming recessed regions by etching sidewalls of the first material layers, which are exposed through the hole;
forming a sacrificial layer in the recessed regions; and
forming the insulating pattern protruding farther than the second material layers by oxidizing the sacrificial layer.

7. A method of manufacturing a resistive memory device, the method comprising:
forming a stack structure in which a plurality of first material layers and a plurality of second material layers are alternately stacked on each other;
forming a hole that penetrates the stack structure through the plurality of first material layers and the plurality of second material layers;
forming an insulating pattern on a sidewall of each first material layer of the first material layers, which is exposed through the hole,
forming an uneven sidewall of the hole by etching a sidewall of each second material layer of the second material layers;
forming a gate insulating layer and a channel layer along the uneven sidewall of the hole, wherein the channel layer includes convex regions, in relation to a central portion of the hole, and concave regions, in relation to the central portion of the hole, between the convex regions; and
forming variable resistance layers on the concave regions of the channel layer.

8. The method of claim 7, wherein the forming of the variable resistance layers includes:
forming the variable resistance layers along a surface of the channel layer; and
exposing the convex regions of the channel layer by performing an etching process such that the variable resistance layers remain only on the concave regions of the channel layer.

9. The method of claim 7, further comprising forming a vertical insulating layer inside of the hole.

10. The method of claim 7, further comprising removing the second material layer that is exposed through a slit that is penetrating the stack structure and filling a space in which the second material layer is removed with a third material layer after the slit is formed.

11. The method of claim 7, wherein, in the forming of the insulating pattern, the insulating pattern is formed by selectively oxidizing sidewalls of the first material layers, which are exposed through the hole.

12. The method of claim 7, wherein the forming of the insulating pattern includes:
forming recessed regions by etching sidewalls of the first material layers, which are exposed through the hole;
forming a sacrificial layer in the recessed regions; and
forming the insulating pattern protruding farther than the second material layers by oxidizing the sacrificial layer.

* * * * *